(12) United States Patent
Keigler

(10) Patent No.: US 8,425,687 B2
(45) Date of Patent: Apr. 23, 2013

(54) WETTING A WORKPIECE SURFACE IN A FLUID-PROCESSING SYSTEM

(75) Inventor: Arthur Keigler, Wellesley, MA (US)

(73) Assignee: Tel Nexx, Inc., Billerica, MA (US)

( * ) Notice: Subject to any disclaimer, the term of this patent is extended or adjusted under 35 U.S.C. 154(b) by 509 days.

(21) Appl. No.: 12/702,860

(22) Filed: Feb. 9, 2010

(65) Prior Publication Data

US 2010/0212694 A1  Aug. 26, 2010

Related U.S. Application Data

(60) Provisional application No. 61/151,385, filed on Feb. 10, 2009.

(51) Int. Cl.
*B08B 5/04* (2006.01)
*B08B 7/04* (2006.01)

(52) U.S. Cl.
USPC ............. 134/21; 134/25.4; 134/36; 134/137; 134/200

(58) Field of Classification Search .............. 134/21, 134/25.4, 200, 34, 36, 37, 137
See application file for complete search history.

(56) References Cited

U.S. PATENT DOCUMENTS

| | | | | |
|---|---|---|---|---|
| 4,733,631 A | * | 3/1988 | Boyarsky et al. | 118/719 |
| 5,310,441 A | * | 5/1994 | Tsutsumi et al. | 156/382 |
| 6,081,306 A | * | 6/2000 | Nagano | 349/32 |
| 6,179,982 B1 | * | 1/2001 | Ting et al. | 205/80 |
| 6,258,593 B1 | * | 7/2001 | Schembri et al. | 435/287.2 |
| 7,659,966 B2 | * | 2/2010 | Matsumoto | 355/75 |
| 2009/0103162 A1 | * | 4/2009 | Burrell et al. | 359/272 |

* cited by examiner

*Primary Examiner* — Saeed T Chaudhry
(74) *Attorney, Agent, or Firm* — Rothwell, Figg, Ernst & Manbeck, P.C.

(57) ABSTRACT

A method and apparatus for wetting the surface of a workpiece is disclosed. The apparatus includes a chamber with a vacuum port and a fluid port and a workpiece holder including a body, a ring, and a port. The body includes a surface and defines a cavity extending from the surface. The ring is adapted to retain the workpiece on the surface of body over the cavity. The ring forms a fluid seal relative to the workpiece and to the workpiece holder. The port is defined in the body and in communication with the cavity. The port affects pressure in the cavity to minimize a pressure differential between the front and back surfaces of the workpiece. The fluid port is in communication with the chamber. The fluid port delivers a fluid (e.g., a substantially degassed fluid) to wet the front surface of the workpiece during operation of the chamber at a reduced pressure relative to atmosphere.

20 Claims, 26 Drawing Sheets

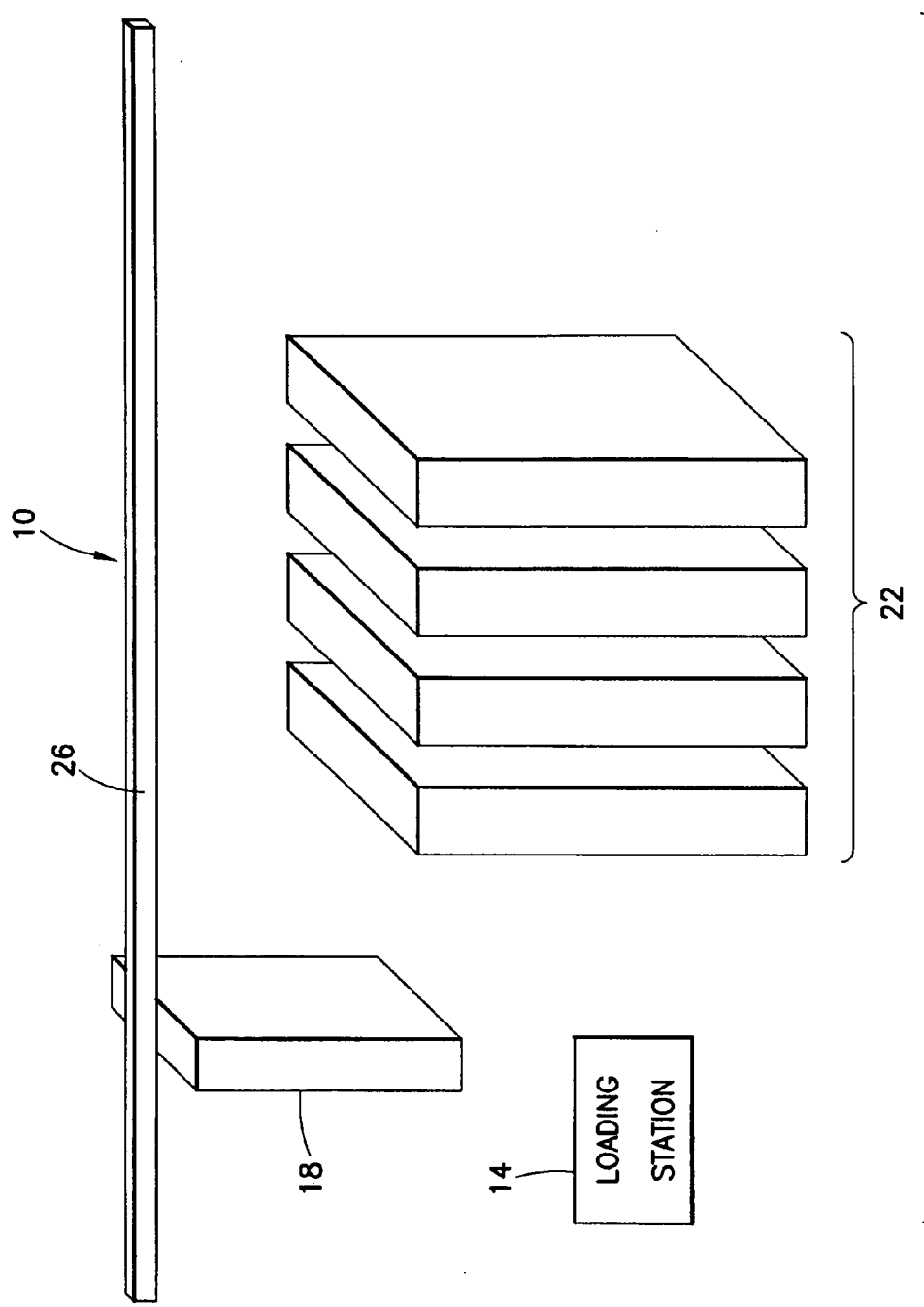

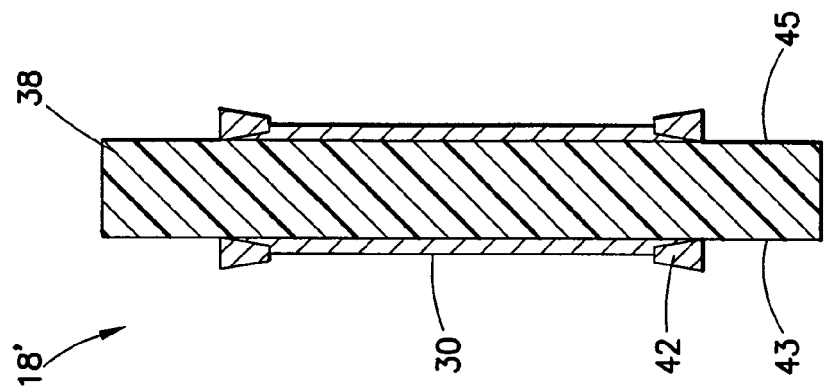
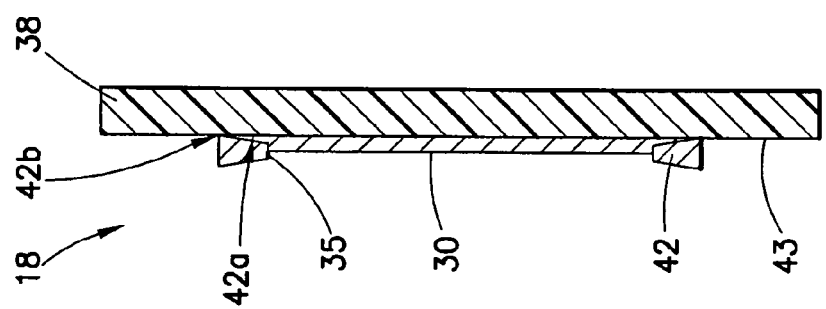

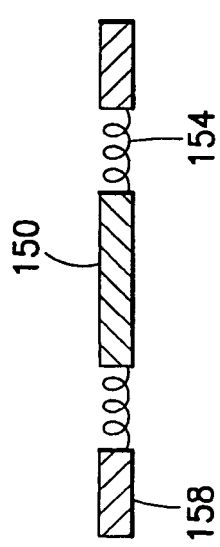
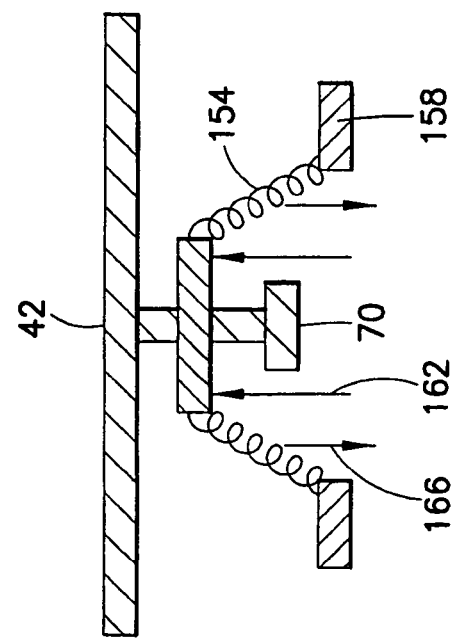
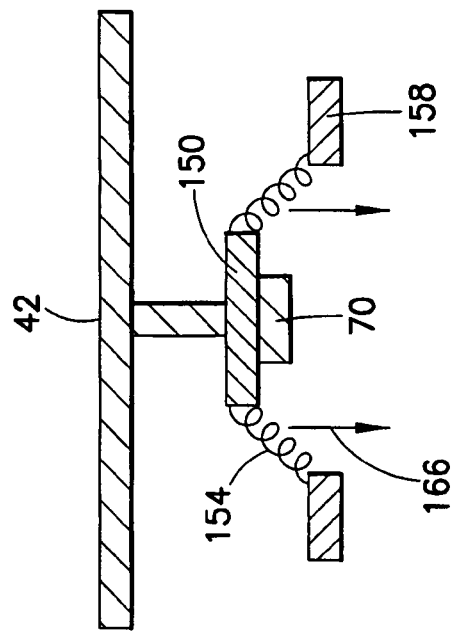

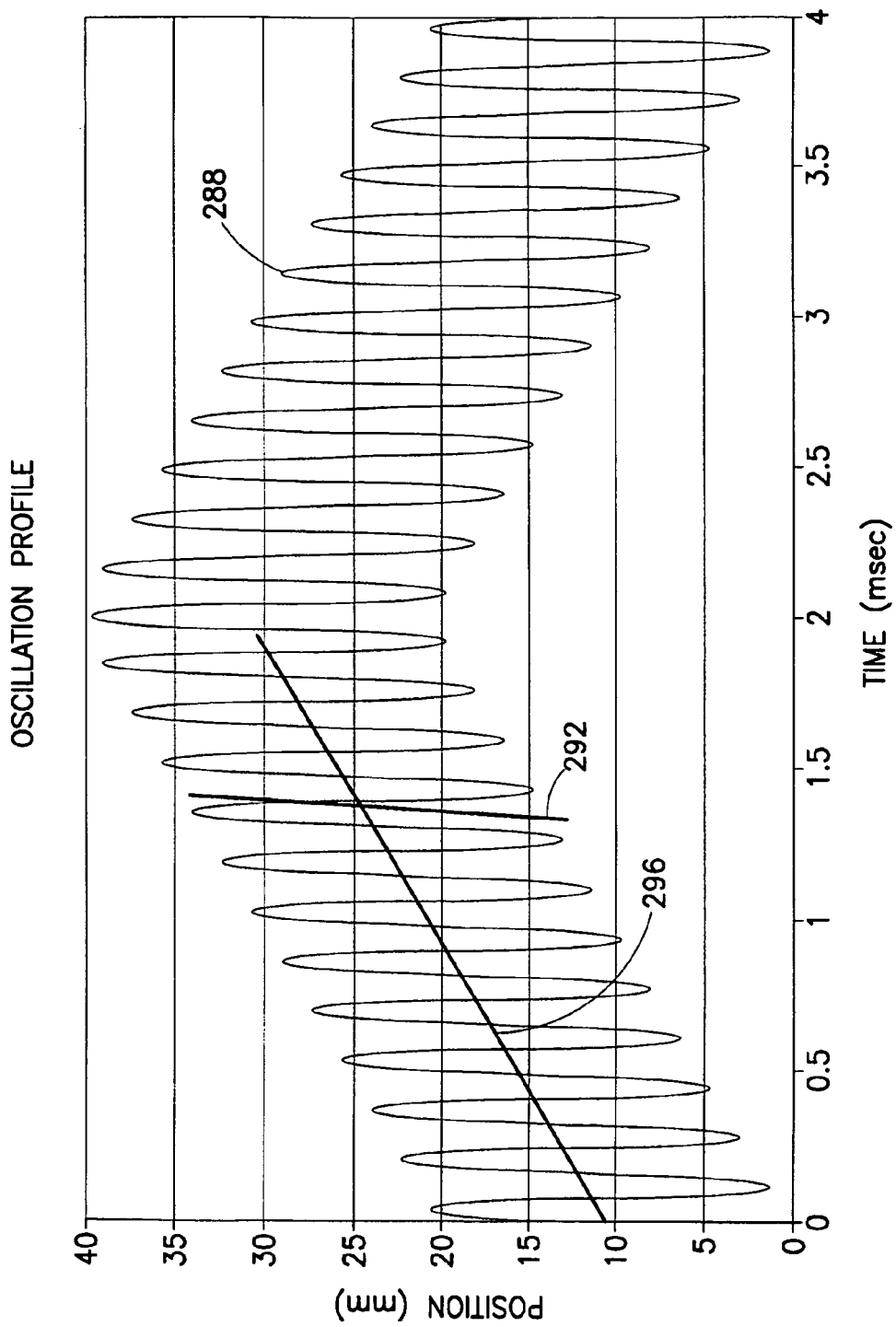

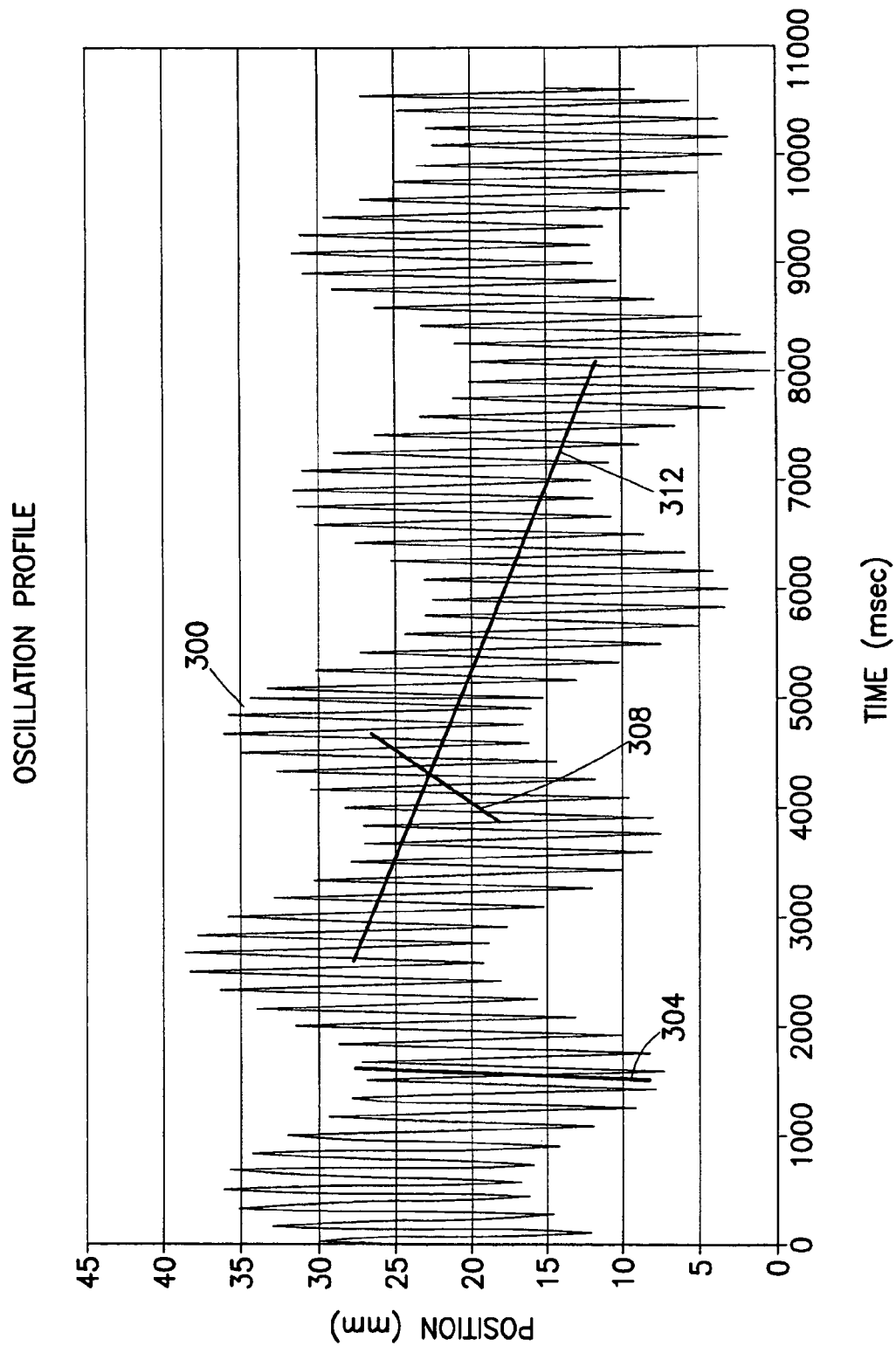

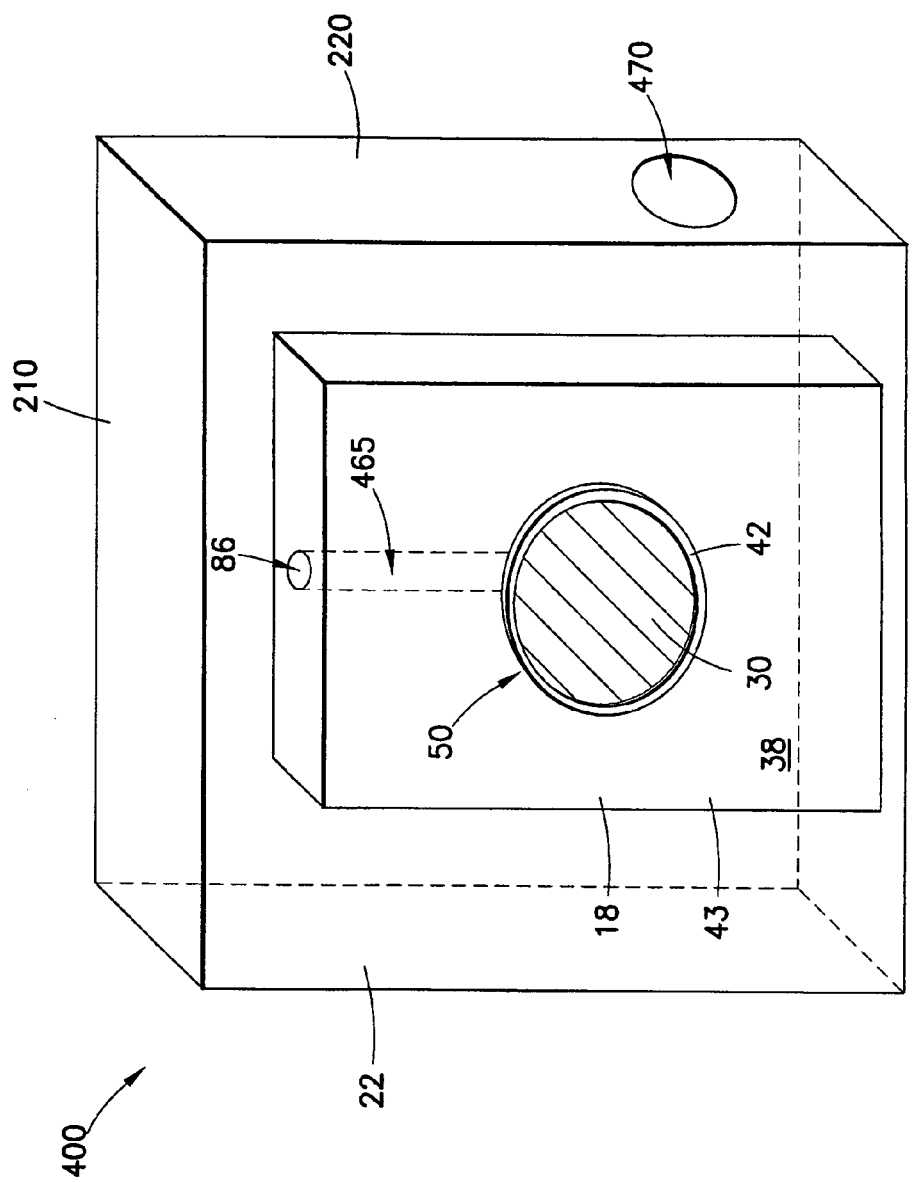

WETTING A WORKPIECE SURFACE IN A FLUID-PROCESSING SYSTEM

CROSS-REFERENCE TO RELATED APPLICATION(S)

This application claims the benefit of U.S. Provisional Application No. 61/151,385 filed Feb. 10, 2009 which is incorporated by reference herein in its entirety.

FIELD OF THE TECHNOLOGY

The technology relates generally to a method and apparatus for fluid processing a workpiece, and more particularly to a method and apparatus for wetting a surface of a workpiece.

BACKGROUND OF THE TECHNOLOGY

Electrodeposition, among other processes, is used as a manufacturing technique for the application of films (e.g.; metal films) to various structures and surfaces, such as semiconductor wafers and silicon workpieces. An important feature of systems used for such processes is their ability to produce films with uniform and repeatable characteristics such as film thickness, composition, and profile relative to the underlying workpiece profile.

Such films can be produced on three dimensional structures in the 1 to 100 micron scale, e.g., voids, vias, cavities, or features on a workpiece surface. A difficulty encountered when electroplating on such structures in a workpiece, whether holes in the workpiece itself, or holes in a photoresist masking film on the workpiece, is wetting the structure. Water and other fluids such as acidic or basic chemistry baths can be used in electrodeposition or electroless deposition. For micron-sized features, the relative strengths of the surface tension forces and viscous forces compared to the fluid mass acceleration or gravitational forces can be different than for large-scale features of 1 millimeter or more. Cohesive forces in the fluid tend to prohibit the fluid from flowing into small features, and therefore it can be difficult to wet such small features with existing methods, such as spraying the fluid through a high-pressure nozzle.

Vacuum impregnation has been used in various other processing applications, such as injection molding. Vacuum impregnation has not been applied to silicon wafer manufacturing or electrodeposition due to the difficulty of achieving a vacuum simultaneously on the front and back surfaces of the workpiece while maintaining a fluid seal to prohibit the fluid from reaching the edge or backside of the workpiece. Without minimizing the pressure differential between the front and back surfaces, the workpiece can be damaged, bowed, or fractured. Such a method and apparatus also has not previously been considered as a method for wetting wafers for electroless deposition.

Prior art systems suffer from one or more of these limitations, and a need therefore exists for new and improved methods and apparatuses for controlling pressure on both sides of one or more wafers in a manner that allows automatic and/or high-speed wetting of the workpiece surface prior to electrodeposition, electroless deposition, or other wafer-level processes.

SUMMARY OF THE TECHNOLOGY

The technology, in various aspects, features systems and components for processing one or more workpieces by the application and removal of gases and fluids from one or more surfaces of the workpiece(s). A workpiece can be planar or substantially planar, and can be thin or ultra-thin. Suitable workpieces include, but are not limited to, semiconductor wafers, silicon workpieces, interconnection substrates, and printed circuit boards. This field is sometimes referred to as fluid processing or wet processing, and includes electrodeposition, electroplating, electroless plating, chemical etching, resist coating, resist stripping, dielectric coating, and workpiece cleaning, among other processes.

A surface of a workpiece, in particular, small cavities, voids, vias, and/or features on the workpiece surface, can be wet prior to subsequent fluid processing steps. Wetting the surface of the workpiece can promote more uniform and/or repeatable fluid processing. For example, wetting the surface of the workpiece can promote more uniform electrodeposition in subsequent processing. Before wetting, vacuum can be applied to minimize cohesive forces in the fluid, and facilitate flowing of a fluid (e.g., a substantially degassed fluid) into the small features. A pressure differential between the front and back surfaces of the workpiece can be minimized to reduce stress and/or strain on the workpiece and avoid damage, bowing, and/or fracture of the workpiece.

In one aspect, the technology features an apparatus for wetting a workpiece having front and back surfaces. The apparatus includes a workpiece holder having a body, a ring, and a port. The body includes a surface and defines a cavity extending from the surface. The ring is adapted to retain the workpiece on the surface of the body over the cavity. The ring forms a fluid seal relative to the workpiece and to the workpiece holder. The port is defined in the body and is in communication with the cavity. The port affects pressure in the cavity to minimize a pressure differential between the front and back surfaces of the workpiece. A fluid port communicates with the chamber and delivers a fluid to wet the front surface of the workpiece during operation of the chamber at a reduced pressure relative to atmosphere.

In another aspect, the technology features a method of wetting a workpiece having front and back surfaces. The method includes retaining the workpiece on a surface of a workpiece holder disposed in a chamber to create fluid seals between the ring and the workpiece and between the ring and the workpiece holder. The pressure is reduced in the chamber relative to atmospheric pressure. The method further includes minimizing a pressure differential between the front and back surfaces of the workpiece. A fluid is introduced to the chamber to wet the front surface of the workpiece.

In yet another aspect, the technology features an apparatus for wetting a workpiece having front and back surfaces. The apparatus includes a means for retaining the workpiece on a surface of a workpiece holder disposed in a chamber and for sealing the back surface of the workpiece from the chamber. The apparatus also includes a means for reducing pressure in the chamber relative to atmospheric pressure. In addition, the apparatus includes a means for minimizing a pressure differential between the front and back surfaces of the workpiece. The apparatus also includes a means for introducing a fluid into the chamber to wet the front surface of the workpiece.

In other examples, any of the aspects above, or any apparatus, system or device or any method, process or technique described herein, can include or more of the following features. The chamber can include a vent valve to return the chamber to atmospheric pressure. In some embodiments, the chamber is vented after introducing the fluid. In some embodiments, a fluid source is coupled to the fluid port. The fluid port can be positioned in a bottom portion of the chamber.

In some embodiments, the fluid is a substantially degassed fluid. The fluid can be introduced from a bottom portion of the chamber. In some embodiments, the fluid source can be adapted to contain the fluid. The fluid can include organic molecules and/or deionized water. In some embodiments, the ring includes contacts adapted for electrical communication with the workpiece. Wetting the workpiece can include contacting features in the workpiece with the fluid to displace a gas or contaminant. In some embodiments, surface tension is reduced between the surface of the workpiece and the fluid.

In some embodiments, an electrode can be adapted to deliver an electric potential to or receive an electric potential from the workpiece while the workpiece is immersed in the fluid.

Other aspects and advantages of the technology will become apparent from the following drawings, detailed description, and claims, all of which illustrate the principles of the technology, by way of example only.

BRIEF DESCRIPTION OF THE DRAWINGS

The advantages of the technology described above, together with further advantages, may be better understood by referring to the following description taken in conjunction with the accompanying drawings. In the drawings, like reference characters generally refer to the same parts throughout the different views. The drawings are not necessarily to scale, emphasis instead generally being placed upon illustrating the principles of the technology.

FIG. 1 depicts a block diagram of an exemplary production system for a workpiece.

FIG. 2B shows a cross-section of the workpiece holder of FIG. 2A.

FIG. 3 shows a cross-section of an exemplary workpiece holder for retaining a plurality of workpieces according to the technology.

FIGS. 8A-8C depict diagrammatic representations of the movement and action of the member and the flex feature(s) of an apparatus for retaining a workpiece according to the technology.

FIG. 17 shows a graphical view of an exemplary non-uniform oscillation profile for agitating a fluid during fluid processing of a workpiece according to the technology.

FIG. 18 depicts a graphical view of another exemplary non-uniform oscillation profile for agitating a fluid during fluid processing of a workpiece according to the technology.

FIG. 22A shows an illustrative embodiment of an apparatus for wetting a workpiece.

DESCRIPTION OF THE TECHNOLOGY

Figure 2A:
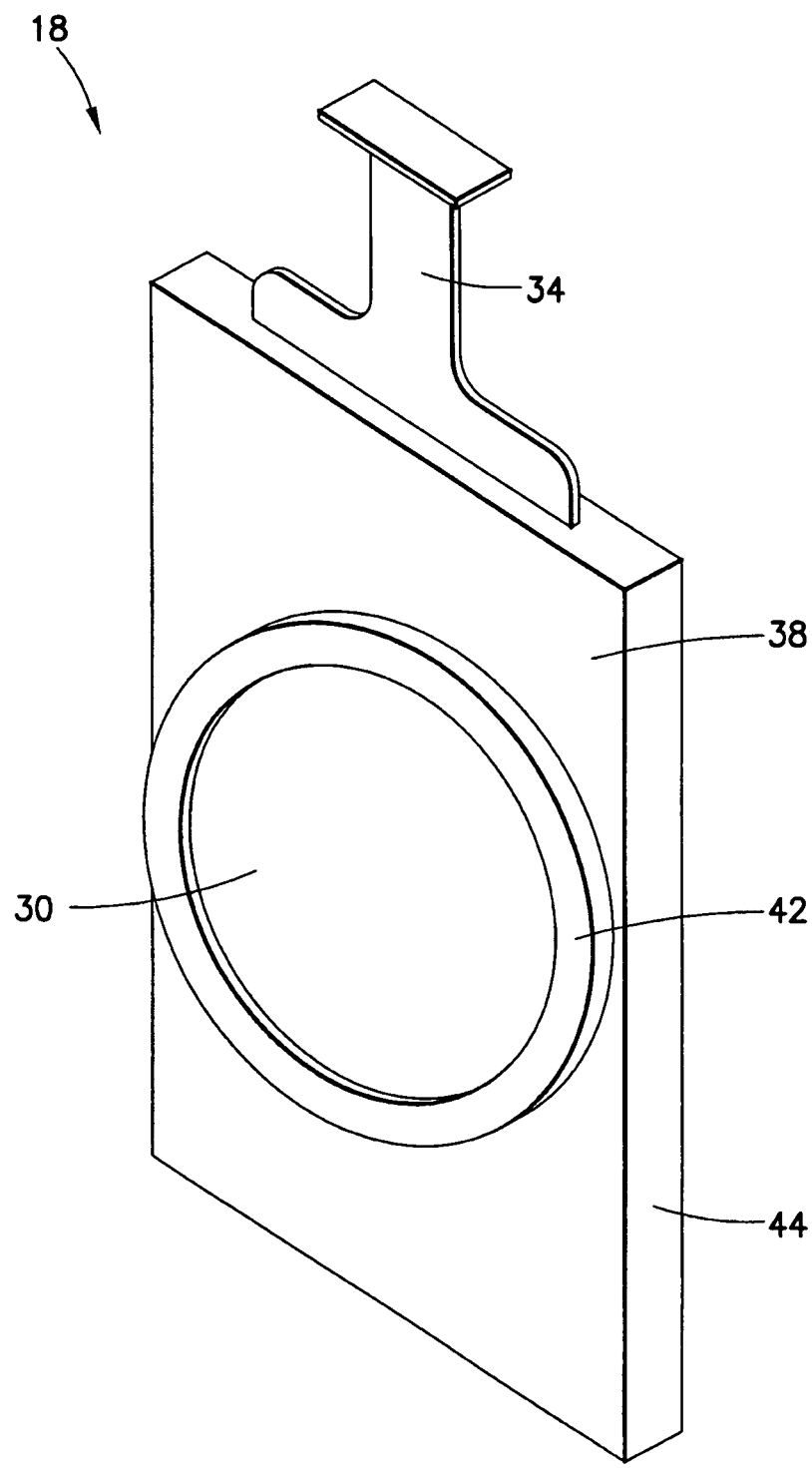
FIG. 2A shows a perspective view of an illustrative embodiment of a workpiece holder according to the technology.

FIG. 1 illustrates an exemplary production system 10 for a workpiece. The production system 10 can utilize various features of the technology. The production system 10 can include a loading station 14 for delivering a workpiece to a workpiece holder 18. The production system 20 can also include one or more modules 22, e.g., process modules, for processing a workpiece. The loading station 14 and the one or more modules can be mounted in a single framework, or in adjacent frameworks. The framework can include a transport system 26 for moving a workpiece holder 18 from the loading station 14 to a first module and between modules. An exemplary production system is a Stratus System available from NEXX Systems, Inc. in Billerica, Mass.

The workpiece (examples of which are shown in subsequent figures) can be planar, substantially planar, and/or thin or ultra-thin. In various embodiments, the workpiece has a circular shape or a substantially circular shape. In other embodiments, the workpiece is non-circular. For example, the workpiece can be rectangular, square, oval, or triangular, or have another suitable geometric configuration. In various embodiments, the workpiece can be, for example, a semiconductor wafer, silicon workpiece, interconnection substrate, printed circuit board, or other workpiece suitable for processing. The loading station 14 can be an automated loading station, such as an automated wafer handling front end available from Newport Automation in Irvine, Calif. or Brooks Automation in Chelmsford, Mass.

The workpiece holder 18, according to the technology, can be used to retain a single workpiece, or a plurality of workpieces. The workpiece holder 18 can utilize a back-to-back configuration for two or more workpieces. Furthermore, the workpiece holder 18 can have a hole bored through its center for processing a plurality of surfaces of a single workpiece. These embodiments are described in more detail below.

Each of the one or more modules 22, according to the technology, can be used for cleaning, rinsing, drying, pretreating, plating, buffering/holding, etching, electrodepositing, electroplating, electroetching, electrodissolution, electroless depositing, electroless dissolution, photoresist depositing, photoresist stripping, chemical etch processing, seed layer etching, and similar processes requiring fluid flow and/or electric field control and use. In various embodiments, the workpiece is retained by the workpiece holder 18 while processing is performed. Each of the one or more modules 22 and/or the workpiece holder 18 can be used to apply a variety of films to a surface of a workpiece, including, but not limited to, metal, plastic, and polymer films. Suitable metals include, but are not limited to, copper, gold, lead, tin, nickel, and iron. In addition, alloys, compounds, and solders of these metals (e.g., lead/tin and nickel/iron) can be applied to a workpiece surface.

In various embodiments, the film deposited can have a thickness between about 1 |μm and about 150 urn. Using the features of the technology, the film can be high purity, and the thickness can be uniform across the surface of the workpiece. The film can have uniform electrical properties on (i) a flat, continuous uniform surface, (ii) on a flat continuous surface with micro-scale topography, and/or (iii) on a flat surface with topography and/or photo-resist patterning.

In various embodiments, the production system 10 can include between one and thirty modules, although additional modules can be used depending on the application. Various novel features of the one or more modules 22 are described in more detail below. Each of the one or more modules 22 can include a robust and modular construction so that it can be removed from the production system 10, As such, the production system 10 can be customizable for specific applications. For example, a module and a workpiece holder can be configurable for processing different sized workpieces, e.g., 150, 200, 250 or 300 mm wafers, with minimal lost production time during customization.

In addition, the layout of a processing system, e.g., the position or sequence of one or more process modules, can be optimized for a specific fluid process or for a series of processes, which can lead to increased throughput. For example, a vertical line architecture, e.g., as utilized by the Stratus system, can be combined with a dual wafer processing system. Deposition modules can be about 20 cm wide, and the number of modules can be adjusted to match the rate of the loading station. An exemplary rate is about 40 workpieces per hour.

Furthermore, the layout of a processing system can Orient a workpiece in a vertical configuration. For a process or series of processes having a long deposition time, a vertical configuration can enable a significant number of workpieces to be processed simultaneously. For example, for a process time longer than about 10 minutes, over 20 workpieces can be processed simultaneously. In addition, in a process that generates substantial volumes of gas or air at the workpiece surface, e.g., electrophoretic deposition of photoresist, a vertical configuration can facilitate the removal of air or gas bubbles from the surface of a workpiece.

The production system 10 itself can be manual or automated. The production system 10 can include a computer that controls the operation of the loading station 14 and/or the transport system 26, as well the one or more modules 22. In one exemplary embodiment of an automated system, a freshly loaded workpiece is transported from the loading station 14 to the most distant module, and then subsequent processing returns the finished workpiece to the loading station 14.

FIG. 2A shows an illustrative embodiment of a workpiece holder 18 for retaining a workpiece 30. In this illustrative embodiment, the workpiece holder 18 includes a handle 34 that can be used to lift and/or transport the workpiece holder 18. The handle can be engageable with the transport mechanism 26 shown in FIG. 1. The workpiece holder 18 also includes a body 38 and a ring 42 for contacting the workpiece 30. In various embodiments, the body 38 of the 20 workpiece holder 18 is formed from a plastic, such as high density polyethylene (HDPE) or polyvinylidene fluoride (PVDF). The body 38 can also include a guide strip (shown in FIGS. 5 and 6) formed in at least one edge 44. The guide strip(s) can be used to align the workpiece holder 18 in one of the modules 22.

The ring 42 can press, hold, and/or retain the workpiece 30 against the body 38 of the workpiece holder. Contact between the workpiece 30 and the ring 42 occurs at the outer perimeter of the workpiece 30, e.g., by contacting less than 2 mm of the outer perimeter of the workpiece 30. In various embodiments, the ring 42 includes a flexible member encased in an elastomer. Portion(s) of the elastomer can be used to contact the workpiece 30, and, in some embodiments, can create a seal with the workpiece 30.

In various embodiments, the ring 42 can have a circular shape, a substantially circular shape, or be non-circular (e.g., rectangular, square, oval, or triangular, or have another suitable geometric configuration). In one embodiment, the ring 42 has a low profile relative to the workpiece 30. For example, in one detailed embodiment, the ring 42 extends less than about 1 mm beyond the plane of the exposed surface of the workpiece 30. In various embodiments, the ring 42 can be a contact ring or a sealing ring. In one embodiment, the ring 42 is the sealing ring assembly described in U.S. Pat. No. 6,540, 899 to Keigler, the entire disclosure of which is herein incorporated by reference.

FIG. 2B depicts a cross-section of the workpiece holder of FIG. 2 A. The ring 42 can include a first portion 42a and a second portion 42b. The first portion 42a can contact an outer perimeter 35 (e.g., less than 2 mm of the outer perimeter) of the workpiece 30. The second portion 42b can contact a surface 43 of the workpiece holder 18. The first portion 42a and second portion 42b of the ring 42 can form a fluid seal relative to the workpiece 30 and the workpiece holder 18.

FIG. 3 depicts a cross-section of an illustrative embodiment of a workpiece holder 18' that can be used to retain a plurality of workpieces 30. The body 38 of the workpiece holder 18' includes a first surface 43 in a first plane and a second surface 45 in a second plane (e.g., a front surface and a back surface). Each surface has associated with it a ring 42 for retaining a respective workpiece 30, e.g., for retaining the respective workpiece 30 against the respective surface 43 or 45 of the workpiece holder 18'. For example, a first ring can retain a first workpiece on the first surface of the workpiece holder in the first plane, and a second ring can retain a second workpiece on the second surface of the workpiece holder in a second plane. A suitable example of a processing apparatus or systems similar to system 10, including modules and workpiece holders therein is described in U.S. Publication US2005/0167275A1, dated Aug. 4, 2005 incorporated by reference herein in its entirety.

According to the embodiment illustrated in FIG. 3, the first and second planes are parallel to each other and spaced apart. In various embodiments, the first and second planes form an angle. In one embodiment, the first and second planes are orthogonal. In other embodiments, the first and second planes form either an acute angle or an obtuse angle. It is understood that the technology is not limited to a workpiece holder with only two planes. Embodiments using a single plane or more than two planes can be used. Two planes are used here to illustrate an exemplary embodiment of an apparatus retaining a plurality of workpieces.

In one embodiment, the workpieces are held in a back-to-back configuration, and, in a detailed embodiment, the workpieces are centered on each other in the back-to-back configuration. In some embodiments, the workpieces are held on distinct surfaces of the workpiece holder and are offset from one another. In another embodiment, a plurality of workpieces can be held on a single surface of a workpiece holder, e.g., in a side-by-side configuration. In some embodiments, a plurality of workpieces can be held on one surface of a workpiece holder, while at least one additional workpiece is held on a second surface of a workpiece holder.

Figure 4:
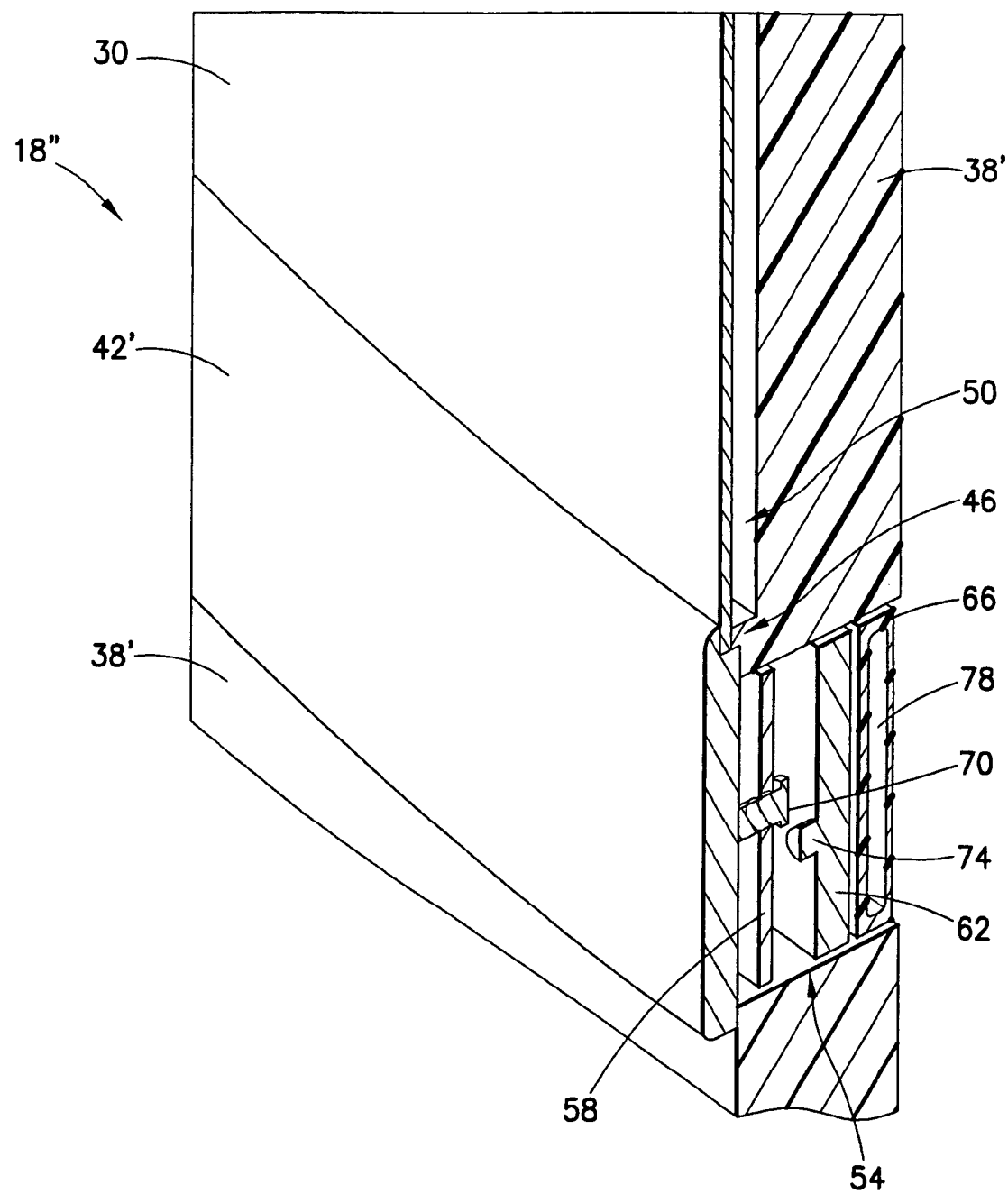
FIG. 4 shows a cross-section of an exemplary workpiece holder according to the technology.

FIG. 4 illustrates a cross-section of another embodiment of a workpiece holder 18", which shows an exemplary system for retaining the workpiece 30 against the workpiece holder 18". A ring 42' holds the workpiece 30 against a body 38' of the workpiece holder 18". The workpiece 30 contacts the body 38' at a contact point 46. The body 38' can define a recess 50 so that the workpiece 30 only contacts a portion of the body 38'.

Figure 5:
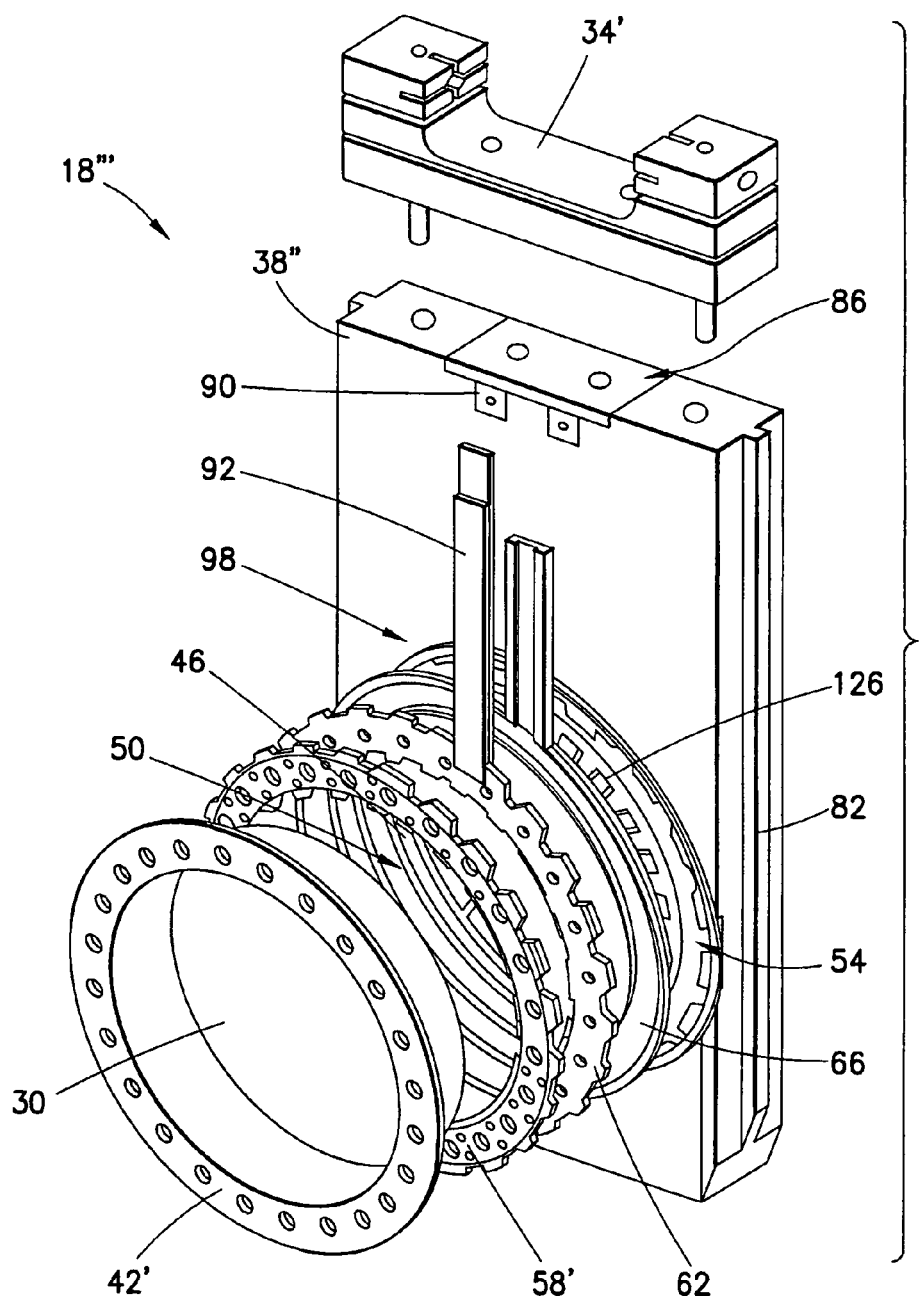
FIG. 5 depicts an exploded view of another exemplary workpiece holder according to the technology.
Figure 6:
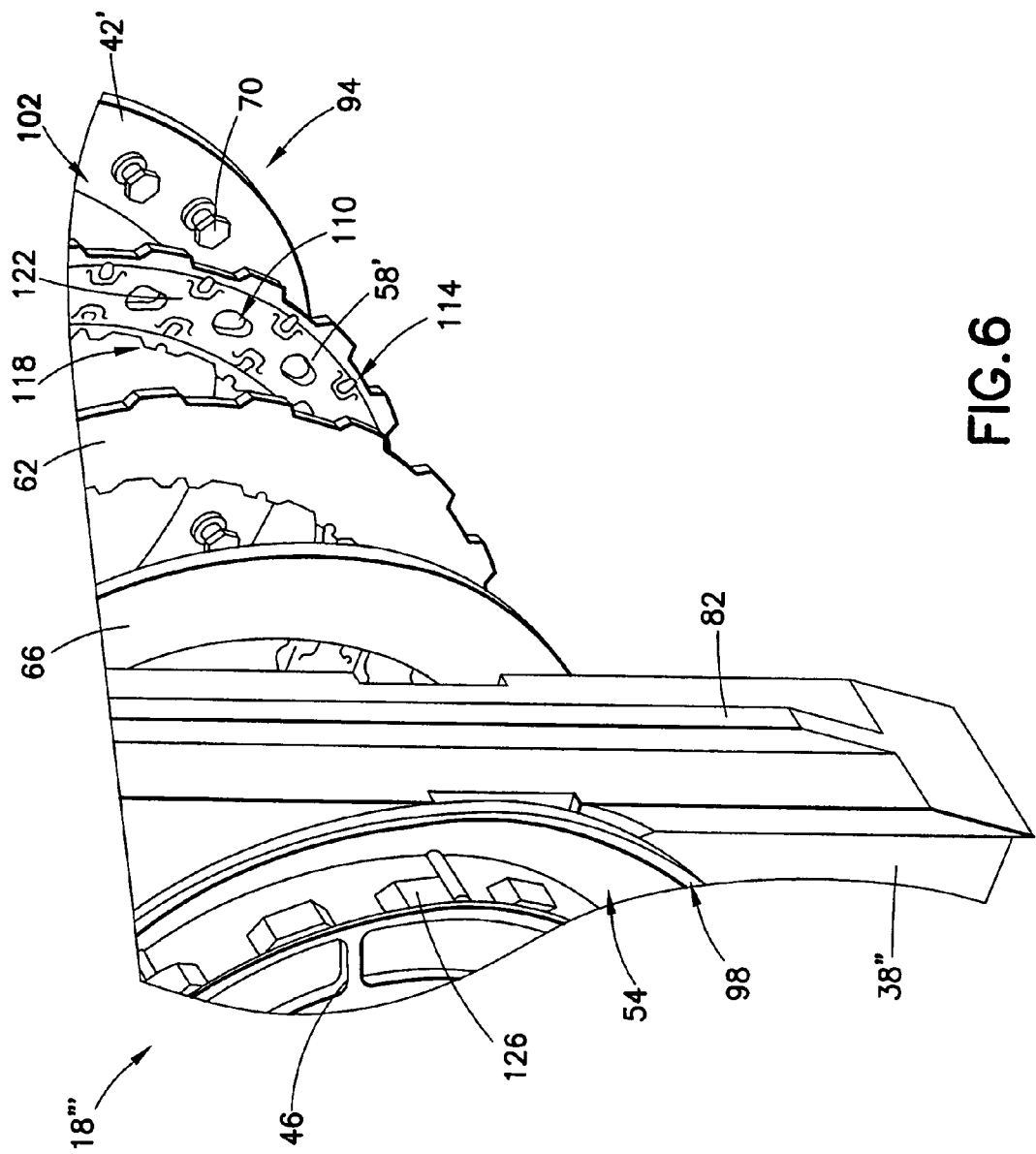
FIG. 6 shows another exploded view of the workpiece holder of FIG. 5.

According to the illustrated embodiment, the body 38' of the workpiece holder 18" defines a groove 54 for holding at least a member 58, a backing member 62, and a bladder 66. The member 58 is flexible, and can also be referred to as a flexure plate. The member 58 can have a circular shape, a substantially circular shape, or be non-circular (e.g., rectangular, square, oval, or triangular, or have another suitable geometric configuration). In some embodiments, the member 58 can be a ring or a plate, and in one detailed embodiment, can have a substantially planar ring-shape. In various embodiments, the member 58 can be formed from a spring-like material, such as stainless steel or titanium. The member 58 can include at least one retaining feature (e.g., as shown in FIGS. 5 and 6) that can engage at least one engagement feature of the ring, for example, engagement feature 70 of the ring 42. In various embodiments, the ring 42' and the member 58 are removably attached to the workpiece holder 18".

The backing member 62 can be a plate or a push plate, and can include at least one push pin 74. In various embodiments, the backing member 62 can have a circular shape, a substantially circular shape, or be non-circular. In various embodiments, the backing member 62 can be a ring or a plate. The backing member 62 can be formed from a metal, a plastic, or a polymer material. The bladder 66, which can be a pneumatic bladder, defines a cavity 78 that can be filled with a fluid, such as air, to inflate the bladder 66. When inflated, the bladder 66 pushes against the backing member 62 causing the at least one push pin 74 to contact the member 58, which causes the member to flex. The bladder 66 can have a circular shape, a substantially circular shape, or be non-circular, and, in various embodiments, can be a ring or a plate. In various embodiments, the bladder 66 can be formed from a fluoroelastomer, urethane, or mylar material.

FIGS. 5 and 6 show exploded views of another exemplary workpiece holder 18'" for retaining the workpiece 30. FIG. 5 shows the view from a first perspective, and FIG. 6 shows the view from a second perspective. This embodiment of the workpiece holder 18'" includes the ring 42', the groove 54, the backing member 62, and the bladder 66. The workpiece holder 18'" can also include a handle 34' and a member 58'.

The workpiece holder 18'" shown in FIGS. 5 and 6 also includes a body 38", which can include a guide strip 82. In one embodiment, the recess 50 defined in the body 38" includes multiple contact points 46 for providing support to the workpiece 30. In the illustrated embodiment, the body 38" includes at least one port 86 for providing a fluid to the bladder 66 and/or vacuum to the underside of the ring 42' via ducts (not shown) in the body 38". In various embodiments, the body 38" can also include at least one electrical contact 90 to communicate electrical current to the workpiece 30. The backing member 62 can be connected to a stud 92 that is engageable with the body 38". The stud 92 provides a force to contact the backing member 62 to the member 58'.

The ring 42' illustrated in FIG. 6 includes at least one engagement feature 70, which, in one embodiment, is formed as one or more studs. A sealing groove 94 can circumscribe the outer perimeter of the ring 42'. The sealing groove 94, which can be an elastomer region of the ring 42', can mate with a sealing boss 98 that can circumscribe a perimeter of the workpiece holder 18'". In one embodiment, this mating forms a barrier to fluid entry, e.g., a fluid-tight seal, between the workpiece holder 18'" and the ring 42'.

In various embodiments, the ring 42' also includes an inner sealing surface 102 that can form a barrier to fluid entry with the workpiece 30. The inner sealing surface 102 can form an electrical connection with the workpiece 30 as well. For example, the inner sealing surface 102 can include flexure fingers that contact the workpiece 30. The flexure fingers can include exposed terminal tips for making electrical contact. The electrical current path can carrying up to 75 amps of electrical current to the workpiece surface and can allow for independent electrical current control to a plurality of workpieces.

In various embodiments, the inner sealing surface 102 can include an elastomer region that is deflected under sufficient force to form a barrier to fluid entry.

In some embodiments, the member 58' defines at least one retaining feature 110 and at least one flex feature 114. The member 58' can include at least one tab section 118. The features of the member 58' can be cut, e.g., laser cut, into the member 58', The at least one retaining feature 110 can be engageable with the at least one engagement feature 70 of the ring 42'. In various embodiments, the at least one retaining feature 110 can be a keyhole slot or a capture slot cut into the member 58'. In one embodiment, the at least one flex feature 114 has a ram's head shape.

In one embodiment, the member 58' defines a plurality of flex features 114. In combination, the plurality of the flex features 114 can provide an effective long path around the main body 122 of the member 58' to allow for substantial flexing of the member 58'. In one embodiment; the plurality of flex features 114 can provide a force at least substantially uniformly around the perimeter of an object, e.g., a workpiece 30, when the member is flexed. The force can be provided substantially normal to the plane of the member 58'. When the force is applied, the ring 42' can retain the object. The flex feature(s) 114, in this embodiment or in other embodiments, can be formed about a perimeter of the member 58', e.g., an inner perimeter, an outer perimeter, or on both the inner and outer perimeters.

In some embodiments, the groove 54, e.g., a ring shaped cavity defined in the body 38", can include at least one tooth feature 126 that can engage at least one tab section 118 of the member 58'. When a plurality of tab sections 118 are flexed away from the main body 122, a force arises between the tab sections 118 perpendicular to the plane of the workpiece 30.

Referring to FIGS. 5 and 6, the ring 42' and the member 58' can be removably attached to the workpiece holder 18'''. In one embodiment, one or more engagement features 70 of the ring 42' can be engaged by (e.g., inserted or attached) one or more retaining features 110 of the member 58'. In an embodiment using keyhole slots, for example, the ring 42' can be rotated by several degrees until the engagement feature(s) stop against the narrower end of the retaining feature(s) 110. This causes the shoulder of the engagement feature(s) 70 to lie behind the member 58'. The bladder 66 can then be partially or entirely deflated. Flexure force formed by the flex features 114 causes the member 58' to deflect and pull against the one or more engagement features 70. In this embodiment, this pulls the ring 42' toward the workpiece holder 18'''.

In one embodiment, flexing a member provides a force to at least one engagement feature to cause a ring to form a barrier to fluid entry with a workpiece. For example, the force can cause the member 58' to pull the at least one engagement feature 70 of the ring 42' to cause it to push against the workpiece to form the barrier to fluid entry. The at least one flex feature 114 can be adapted to provide the force substantially normal to the plane of the member 58' to form the barrier. The flex feature 114 can be positioned about a perimeter of the member 58' to provide the force at least substantially uniformly from the perimeter (e.g., an inner perimeter, an outer perimeter, or as shown in FIGS. 5 and 6, both the inner and outer perimeters.) The force deforming the member 58' can be about one kilogram per linear centimeter of the ring's 42' perimeter.

To remove a first workpiece from the workpiece holder or to exchange a first and second workpiece, the force between the member 58' and the ring 42' can be removed by inflating the bladder 66 so that the backing member 62 contacts the member 58' (with or without push pins 74) to deform it. The force engaging the engagement feature(s) 70 is relaxed so that they can be disengaged from the retaining feature(s) 110. In one embodiment, the force engaging the engagement feature(s) 70 is relaxed so that the ring 42' can be rotated and moved away from the workpiece holder 18'''. The first workpiece can be removed from the ring 42', and if desired, a fresh workpiece can be disposed on the ring 42'.

In one embodiment, the fluid seal can hold the workpiece with sufficient force to prohibit fluid intrusion even when all power to the processing system is lost due to an unforeseen event. In one embodiment, the barrier to fluid entry can be tested after a workpiece loading procedure and/or prior to processing a workpiece to ensure a workpiece has been properly loaded. For example, a small vacuum, e.g., about minus 0.05 atm, is applied to the cavity of the workpiece holder 18'''. The vacuum can be applied, for example, to the recess 50. The path to the vacuum can then be closed off, and the leak-up rate of the vacuum can be measured. If the vacuum in the workpiece holder 18''' does not change by more than a prescribed amount over a defined time period, then the integrity of the barrier is considered to be verified (e.g., about 10 percent in less than about 5 seconds). If the vacuum changes at a faster rate, the ring 42' may not be mounted properly, and the workpiece can be unloaded and reloaded.

Figure 7:
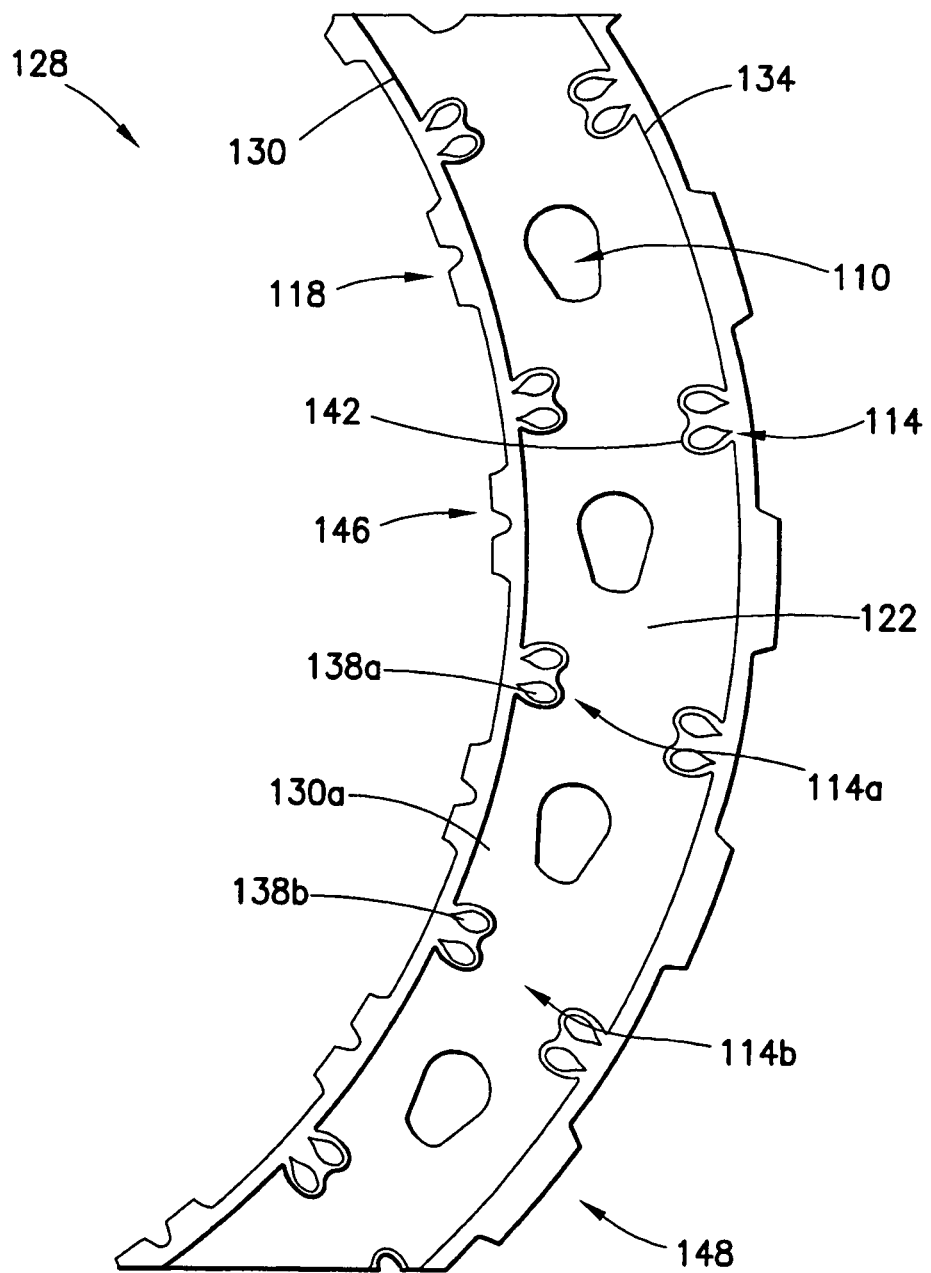
FIG. 7 shows a plan view of a portion of an exemplary member having a plurality of flex features according to the technology.

FIG. 7 shows a detailed view of a portion 128 of the member 58', including retaining features 110, flex features 114, and tab sections 118. As illustrated, the member 58' defines lines 130 and 134 extending about the inner and outer perimeters of the member 58', respectively. The lines 130 and 134 are cut at least substantially through the main body 122. In one detailed embodiment, the lines 130 and 134 are cut through the main body 122. The lines do not extend continuously about the perimeters. Instead, the lines 130 and 134 are series of distinct lines. For example, line 130a extends from a first retaining features 114a to an adjacent flex features 114b. The line 130a terminates in the two tear-drop shaped regions 138a and 138b defined in the flex features 114a and 114b, respectively. According to the illustrated embodiment, the flex feature 114,114a or 114b also includes an Q-shaped line 142. In one embodiment, two proximate teardrop shaped regions and an Q-shaped line combine to form an individual flex feature. The flex feature can have a ram's head shape.

In one embodiment, using a series of distinct lines can provide a substantially long path around a perimeter of the member along which the member can be flexed. Furthermore, using a series of distinct lines can promote an at least substantially uniform force from the perimeter. In various embodiments, the tab sections 118 include a notch 146. In one embodiment, the notch 146 interfaces with a corresponding catch in a groove 54 of the workpiece holder. The notch 146 can prevent the member 58' from rotating. The member 58' can include outer tab sections 148, which can be used to retain the member 58' in the workpiece holder.

The movement of the member 58 or 58' and the action of the flex feature(s) 114 can be shown diagrammatically. For illustrative purposes and without being bound to theory, FIGS. 8A-8C show diagrammatic representations.

FIG. 8A shows the member 58 or 58' in a relaxed state. Plate 150 and springs 154 represent the member 58 or 58'. The flex feature(s) 114 can act like springs 154 to apply force. Anchor points 138 represent restraining features of a workpiece holder. For example, the anchor points 138 can be the tooth feature(s) 126 formed in the groove 54 of the workpiece holder. The anchor points 138 can restrain the tabs sections 118 of the member 58 or 58'.

FIG. 8B shows a portion of the ring 42 or 42', including the engagement feature 70 (shown as a stud in FIGS. 8B and 8C). A force 162 is applied to the plate 150 (i.e., the member 58 or 58') to flex the member 58 or 58' into an overextended state. When overextended, engagement between the ring 42 or 42' and the member 58 or 58' can be made (e.g., in one embodiment, the retaining feature captures the engagement feature). In a detailed embodiment, engagement occurs between the engagement feature 70 and the retaining feature 110. In one embodiment, the force 162 is applied by the backing member 62. The springs 154 (i.e., the flex features 114) exert a force 166 in substantially the opposite direction as the force 162.

Figure 9:
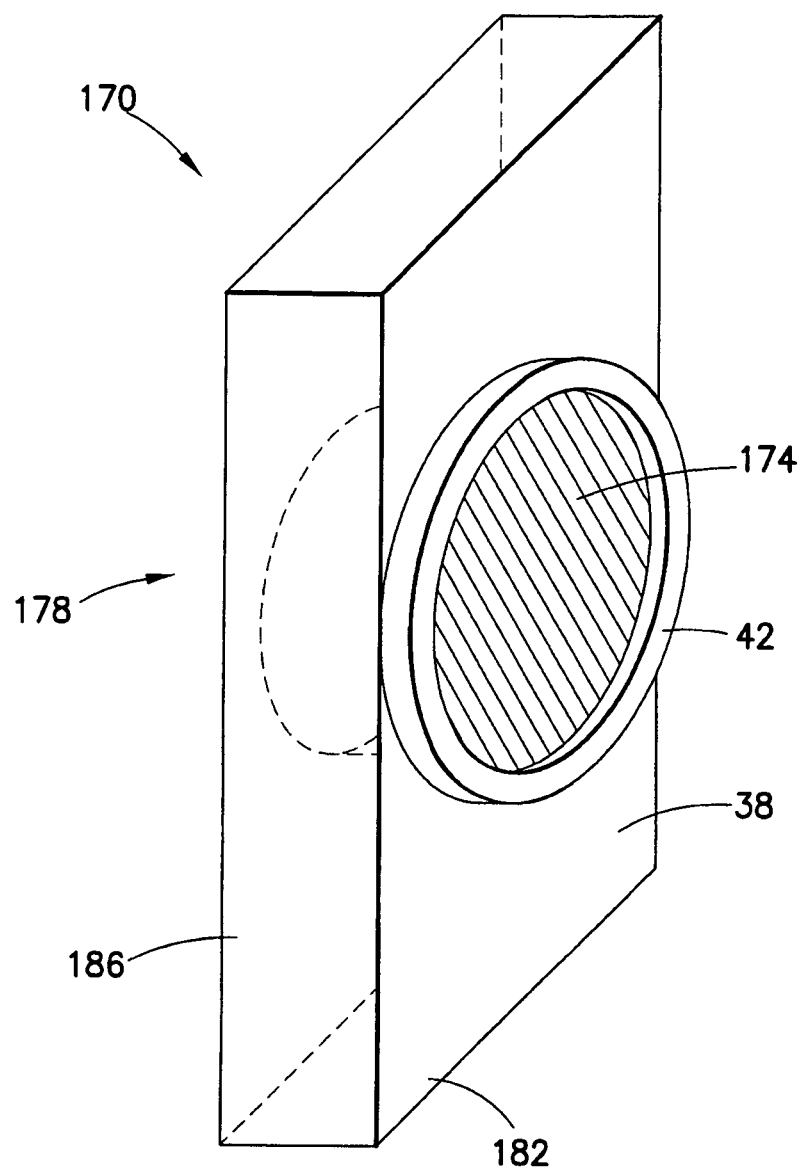
FIG. 9 depicts a perspective view of another exemplary workpiece holder including a hole bored through for processing a plurality of surfaces of a workpiece according to the technology.

FIG. 8C depicts the apparatus in a state where the member 58 or 58' is applying the force 166 to the engagement feature 70 via its retaining feature 110. The springs 154 exert the force 166 substantially normal to the plane of the member 58 or 58'. In one embodiment, the force 166 causes the member 58 or 58' to pull the engagement feature 70, which causes the ring 42 or 42' to contact the workpiece 30. This contact can form a barrier to fluid entry between the workpiece 30 and the ring 42 or 42', FIG. 9 depicts another exemplary embodiment of a workpiece holder 170. This embodiment can be used to process a plurality of surfaces of the workpiece 30. The workpiece holder 170 includes a ring 42 for retaining the workpiece. The body 174 of the workpiece holder 170 defines a hole 178 bored through from a first surface 182 to a second surface 186. The diameter of the hole 178 is smaller than the diameter of the ring 42. In various embodiments, the workpiece holder 18''' includes the features described above including, but not limited to, the member 58 or 58', the backing member 62, and the bladder 66. The underside of the workpiece 30 and the edge of the hole 178 can form a seal to isolate these components from the fluid used in the fluid processing.

Figure 10:
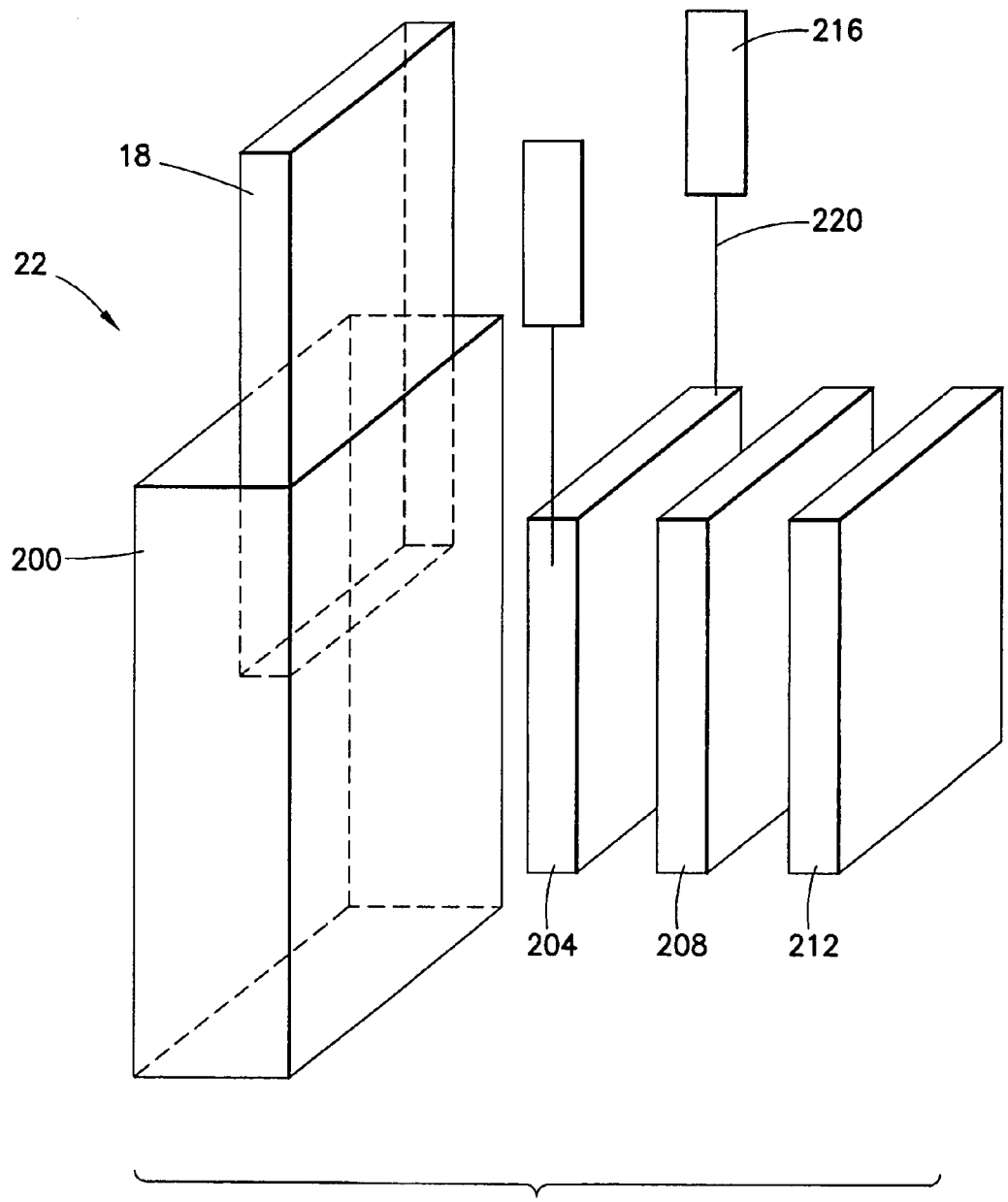
FIG. 10 shows an exploded view of an exemplary apparatus for processing a workpiece according to the technology.

FIG. 10 shows an exemplary apparatus for processing (e.g., fluid processing) a workpiece. The apparatus can include a module 22, which itself can include a housing 200. In one embodiment, the module 22 contains a fluid, e.g., the housing 200 defines a cavity in which the fluid can be disposed. As illustrated in FIG. 10, the apparatus also includes an embodiment of the workpiece holder 18, a member 204, a plate 208, and an anode 212. In some embodiments, one or more of these elements are not used or are not present. Variations are described in more detail below. In various embodiments, the member 204, the plate 208 and/or the anode 212 are disposed within the module 20 and/or the housing 200. Because of the modular design, these elements can be removably or fixably disposed within the housing 200.

In FIG. 10, the workpiece holder 18 is shown removed from the housing 200. The workpiece holder 18 need not be integrated with the module 22 or the housing 200. In one detailed embodiment, the workpiece holder 18 is removable from the housing 200. The workpiece holder 18 can be transportable between two or more modules 22. The housing 200 can include grooves defined in the inner surface of two opposing sides. The edges 44 of the workpiece holder 18 or the guide strips 82 of the workpiece holder 18''' can be inserted into the grooves.

An exemplary housing 200 can be less than about 180 mm in length for electrodeposition or electrotech applications. For applications that do not require a plate 208 or an anode 212, the length can be about 75 mm. The width of the housing 200 can be between about 300 mm and about 500 mm. In an exemplary embodiment for a 200 mm workpiece, the module dimensions can be about 180 mm by 400 mm, although the dimensions can vary depending on the application and/or workpiece size.

In various embodiments, the member 204 is a paddle assembly or a fluid agitation paddle.

In one detailed embodiment, the member 204 is a SHEAR PLATE agitation paddle. The member 204 can be moved substantially parallel to a surface of a workpiece being retained by the workpiece holder 18. The member 204 can be moved with a non-uniform oscillatory motion to agitate the fluid. In various embodiments, the oscillation frequency of the member 204 can be between about 0 Hz and about 20 Hz, although the frequency can be higher depending on the application. In one embodiment, the oscillation frequency of the member 204 is between about 4 Hz and about 10 Hz. In one detailed embodiment, the oscillation frequency is about 6 Hz. In some embodiments, the member 204 is moved by one or more motors 216. The member 204 can be connected to the motor(s) 216 using connection rods 220. In one detailed embodiment, the motor(s) 216 are linear drive motors or a linear motor assembly. Suitable linear motors include linear drive motors available from the LinMot Corporation in Delavan, Wis. In various embodiments, the motors 216 can be fixably or removably attached to the housing 200. The motors 216 can be positioned on the center plane of the housing 200. In one detailed embodiment, the weight of the member 204 and the inertial forces incurred during reciprocating motion of the member 204 is supported by the linear motors via the magnetic field forces between the motor slider and the motor windings rather than by mechanical bearings. The one or more motors 216 can be computer controlled.

In various embodiments, the plate 208 can be a shield plate or shield assembly. The plate 208 can be used to shape the electric field incident on a surface of a workpiece being retained by the member 204. The plate 208' can be formed from a non-conducting materials. Suitable materials include, but are not limited to, HDPE and PVDF. In various embodiments, the plate 208 can have a circular shape, a substantially circular shape, or be non-circular (e.g., rectangular, square, oval, or triangular, or have another suitable geometric configuration). A feature of the plate 208 is that it can be removed and replaced with little effort. This allows a single module to be configurable for processing different sized workpieces with minimal lost production time.

In one embodiment, the anode 212 forms the outer wall of the housing 200. In one embodiment, the anode 212 can be a component of an anode assembly, which forms the outer wall of the housing 200. In various embodiments, the housing 200 has an outer wall and either the anode 212 or the anode assembly are removably attached the wall or spaced from the wall.

In various embodiments, the anode 212 can be a copper disk. In one embodiment, the exposed surface area of the anode 212 is about 300 $cm^2$. In one embodiment, the anode 212 is consumed during electrodeposition or another fluid process such as copper or solder deposition. One feature of the anode 212 is that it can be removed and replaced with little effort, minimizing lost production time.

In embodiment's using an anode 212, the workpiece surface serves as the cathode. It is noted that in some embodiments, it is preferred that the polarity of the system is reversed. That is, the workpiece surface is controlled to be anodic relative to a cathode placed in the module 22. In such an embodiment, the anode 212 would be replaced by a cathode.

Figure 11:
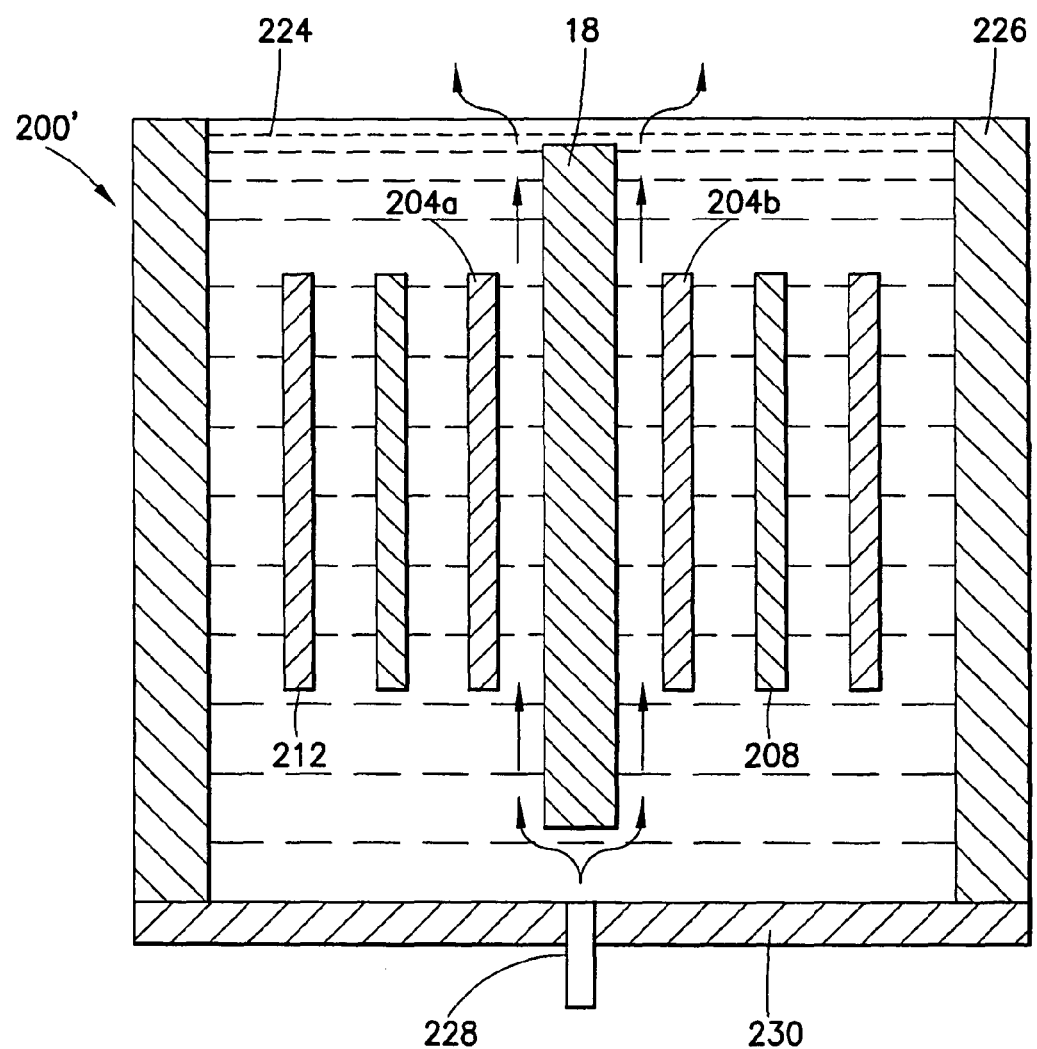
FIG. 11 depicts a sectional view of another exemplary embodiment of an apparatus for processing a workpiece according to the technology.

FIG. 11 shows cross-section of another exemplary embodiment of an apparatus for processing a workpiece. This embodiment can be used, for example, to process two workpieces simultaneously. A housing 200' includes a side wall 224 and end walls 226, and the relative positioning of members 202, members 204a and 204b, plates 208 and anodes 212 is shown. These elements or the distances are not shown to scale. Although the members 204a and 204b are shown as two separate structures, they can form a single assembly.

In an embodiment of the housing 200' for fluid processing, fluid enters the housing 200' through at least one port 228 in a bottom wall of the housing 200'. The port 228 can, in some embodiments, be located in a center portion of the bottom wall 230 of the housing 200'. In one embodiment, the port 228 can be positioned in a bottom portion of a side wall 224. The fluid flows up along the surfaces of the one or more workpieces. The fluid can flow between the workpiece holder 18 and the respective member 204, 204a, or 204b or between the workpiece holder 18 and the plate 208. In various embodiments, the fluid exits the housing 200' through the top of the housing, through a top portion of a side wall 224, or through a top portion of an end wall 226. Arrows show the general direction of flow.

In various embodiments, the flow rate can be between about 20 liters per minute and about 40 liters per minute. In one detailed embodiment, the flow rate is about 28 liters per minute. In one embodiments, the fluid is an electrolyte. The electrolyte can be circulated through the housing 200' from a reservoir during the process. The turnover rate can be about 0.8 minutes at a flow rate of about 27.6 liters per minute. An exemplary solution can include copper sulfate, water, sulfuric acid, and hydrochloric acid.

The distance between a workpiece 30 and the respective member 204, 204a, or 204b can be about 1 mm and about 5 mm, although the distance can vary depending on the application. In one embodiment, the member 204, 204a, or 204b is positioned less than about 2 mm from the surface of the workpiece 30. The shorter the distance between the elements, the better is the fluid mixing at the surface. In a detailed embodiment where the ring 42 extends about 1 mm from the outer surface of the workpiece, the member 204, 204a, or 204b can move in a plane about 1.5 mm from the surface of the workpiece 30. The plate 208 can be positioned between about 2 and about 20 mm from the surface of the workpiece 30, although the distance can vary depending on the application. In one detailed embodiment, the plate 208 is positioned about 5 mm from the workpiece surface.

Figure 12:
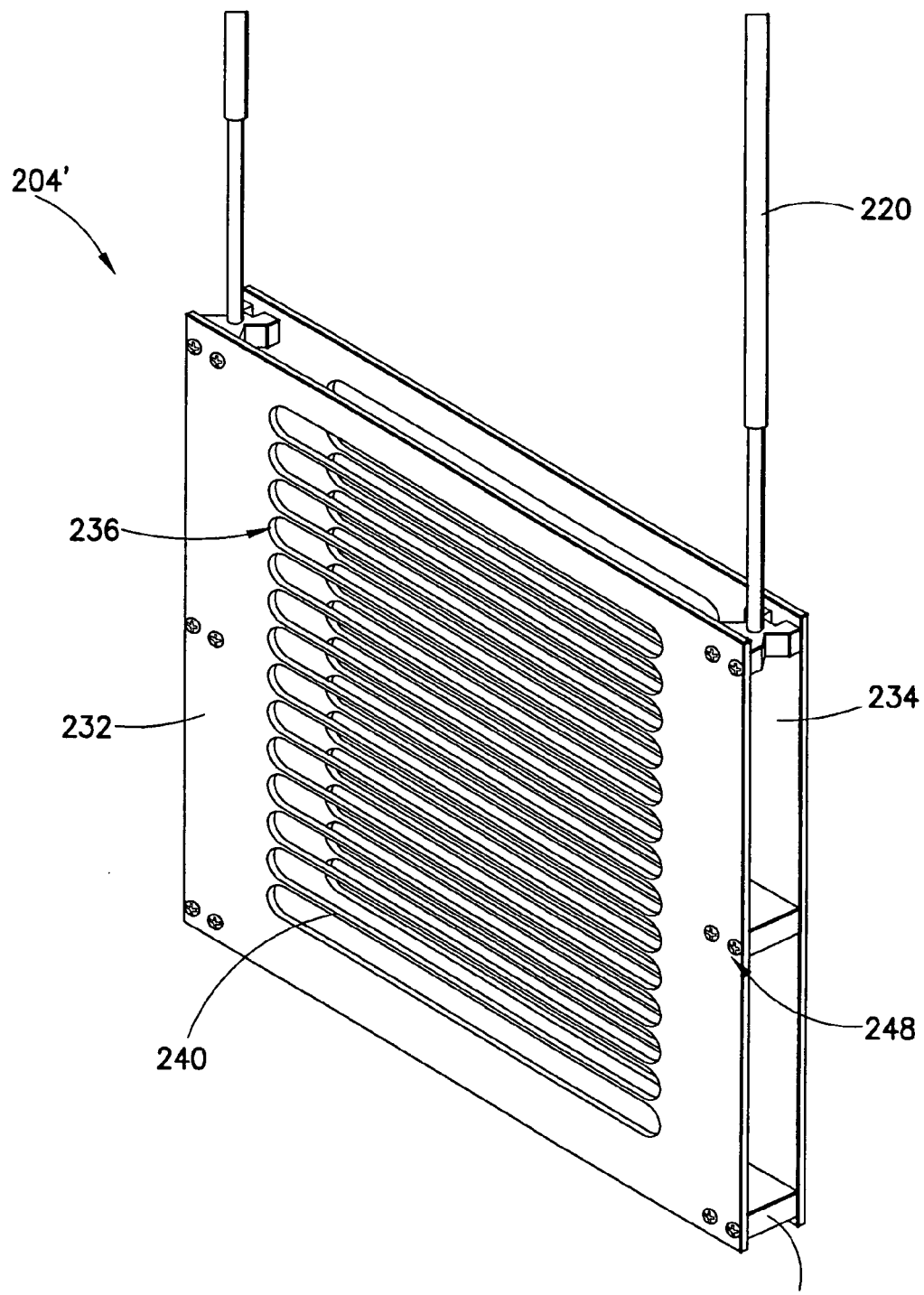
FIG. 12 depicts a perspective view of an exemplary embodiment of a member for agitating a fluid during fluid processing of a workpiece according to the technology.

FIG. 12 depicts a perspective view of an exemplary embodiment of a member 204' for agitating a fluid during fluid processing of a workpiece. The member 204' includes a first plate 232 and a second plate 234. Each plate 232 and 234 defines a series of spaced openings 236.

The shape of the spaced openings 236 can be, for example, oval or rectangular. Each plate 232 and 234 can also include a series of spaced blades 240 for agitating the fluid. The profile of the spaced blades 240 can be straight, angled, cup-shaped, or square. The center points of the series of spaced openings 236 or the series of spaced blades 240 can be positioned in a substantially equidistant periodic array. For example, the centers can be positioned with about 10 to about 30 mm between them. In one detailed embodiment, the centers are position about 20 mm apart. In one embodiment, the series of spaced openings 236 agitates the fluid when the member 204' is moved. In one embodiment, the series of spaced blades 240 agitates the fluid when the member 204' is moved. In one embodiment, both the openings 236 and the blades 240 agitate the fluid. In one detailed embodiment, an edge surface of a spaced blade 240 agitates the fluid.

The plates 232 and 234 can be formed from a suitable metal, plastic, or polymer. Suitable metals include titanium, stainless steel, or aluminum. Suitable plastics include polyvinyl chloride (PVC), chlorinated PVC (CPVC), HDPE, and PVDF. In various embodiments, either of the plates 232 and 234 can be positioned between about 2 mm and about 10 mm from the surface of the workpiece, although smaller or larger distances can be used depending on the application. In a detailed embodiment, the thickness of at least one of the plates 232 and 234 is between about 3 mm and about 6 mm, although smaller or larger distances can be used depending on the application and/or the construction of the material. Relatively thin pieces can be used so that the plate 208 can be positioned as close to the workpiece as possible. This improves the uniformity of deposition.

The first and second plates 232 and 234 can be joined by one or more spacer features 244 and to form the member 204'. In FIG. 12, the first and second plates 232 and 234 are shown attached to the spacer features 244 by screws 248, although other means may be used, including, but not limited to, rivets, glues, epoxies, adhesives, or outer suitable attachment means. The plates 232 and 234 and the spacer features 244 can define a cavity in which an embodiment of the workpiece holder 18 can be inserted during processing. The spacer features 244 can facilitate alignment of the member 204' to the workpiece holder 18.

In various embodiments, the member 204 or 204' can be aligned to the workpiece holder 18 by the housing 200 in a manner that offers high precision without requiring mechanical support of the member 204 or 204'. As described above, the motors 216 can support the member 204 or 204'. Precise and consistent separation between the member 204 or 204' and the workpiece holder 18 can be achieved using guide wheels (not shown) mounted on the housing 200. The guide wheels can turn freely on an axle that is securely mounted on a side wall of the housing 200. Alignment wheels can also be mounted the housing 200 for positioning the workpiece holder 18. The relationship between the guide wheels and the alignment wheels can be such that the member 204 or 204' to the workpiece surface is consistent to within less than about ¼ mm. This promotes a substantially uniform fluid boundary layer to occur at the workpiece surface when the member 204 or 204' is moved substantially parallel to the workpiece surface.

The axles for guide wheels can serve as journal bearing shafts. The member 204 or 204' can be moved with virtually zero frictional or bearing forces, which can significantly reduce repair and maintenance costs that are associated with systems that use load bearing frictional surfaces or bearings.

Figure 13:
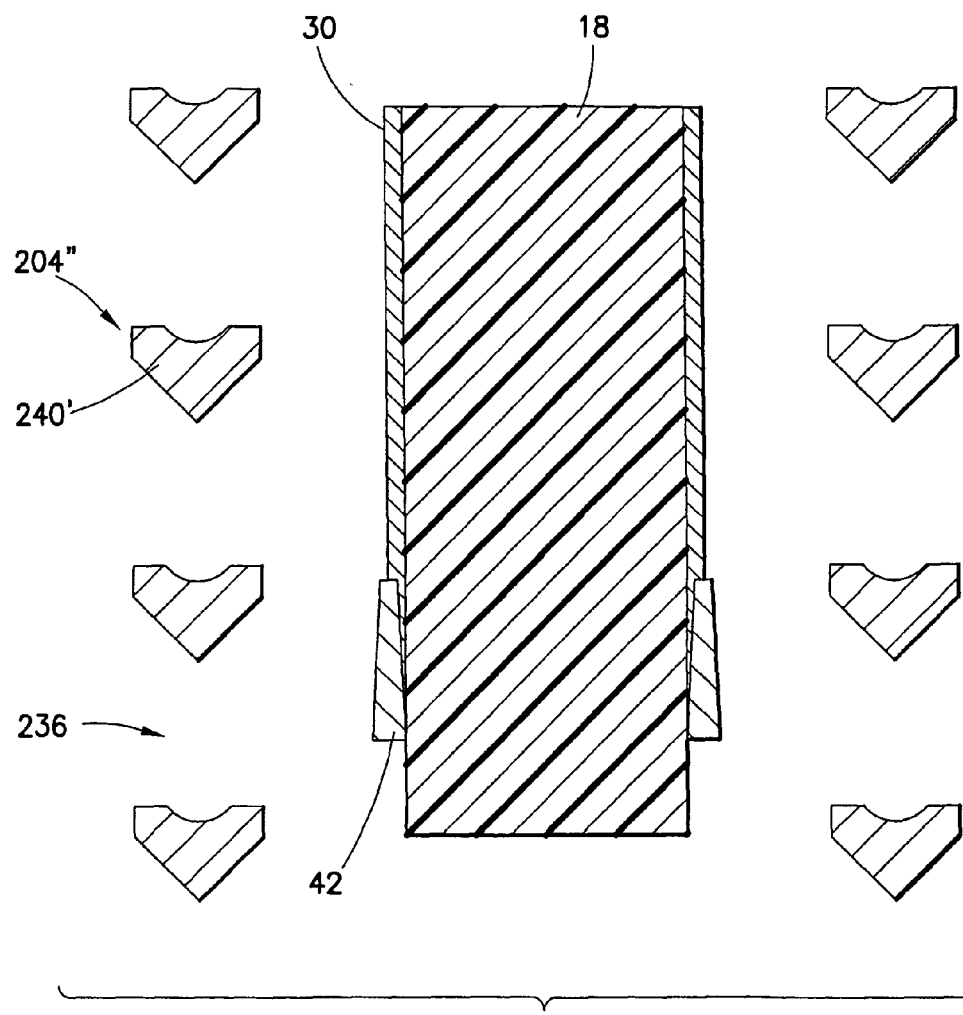
FIG. 13 shows a section view of another exemplary embodiment of a member for agitating a fluid during fluid processing of a workpiece according to the technology.

FIG. 13 shows a cross-section of another exemplary embodiment of a member 204" for agitating a fluid during fluid processing of a workpiece. The spaced blades 240' have a cup shape. In FIG. 13, the spaced bladed 240' are shown adjacent the workpiece 30 being retained on the workpiece holder 18 using the ring 42. In various embodiments, the series of spaced openings 236 and/or the series of spaced blades 240' agitate the fluid when the member 204" is moved. In one embodiment, an edge surface of a spaced blade 240' agitates the fluid. In this embodiment, the edge surface can be a side surface, a pointed surface, or a rounded surface.

Figure 14:
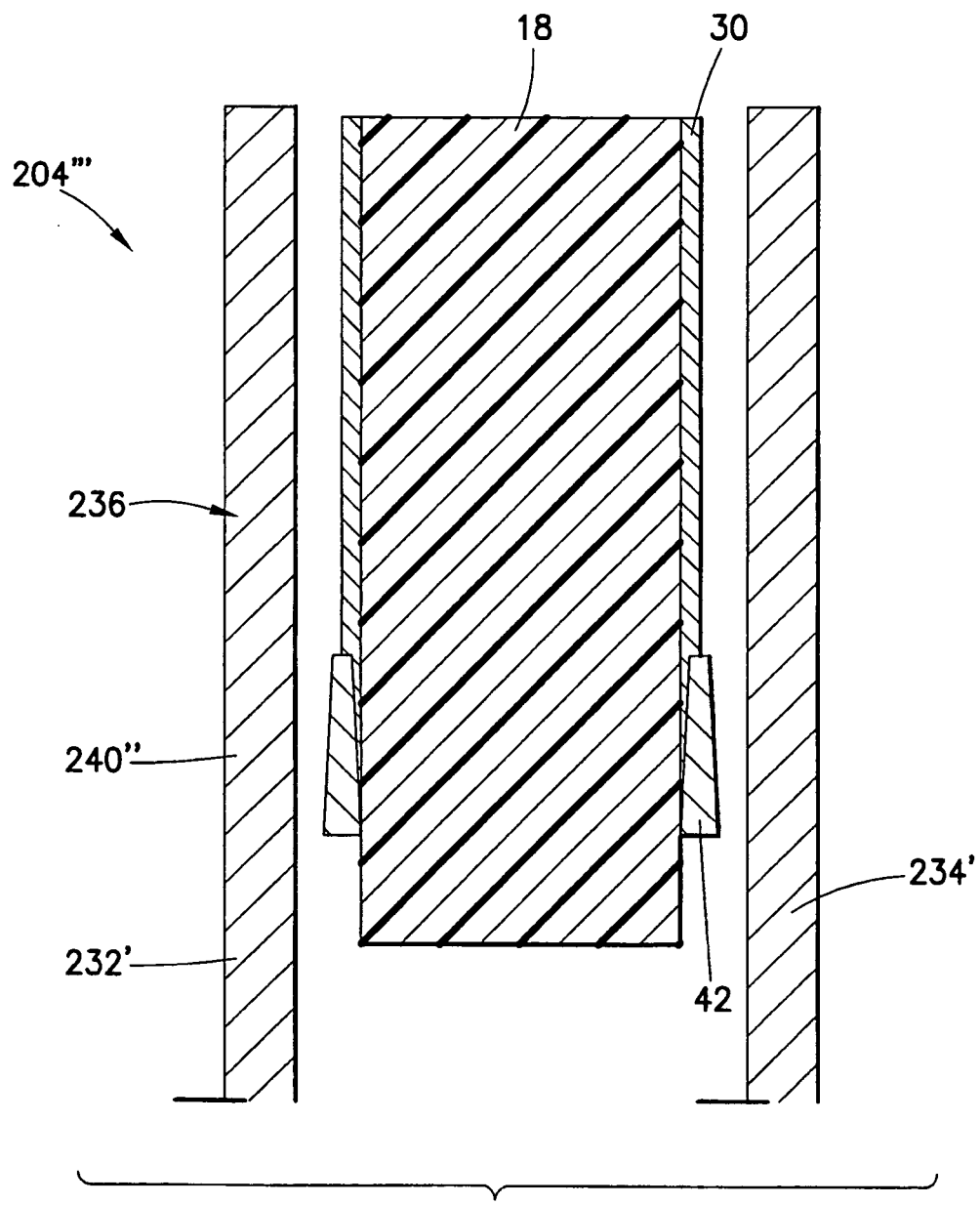
FIG. 14 shows a section view of another exemplary embodiment of a member for agitating a fluid during fluid processing of a workpiece according to the technology.

FIG. 14 shows a cross-section of another exemplary embodiment of a member 204'". The spaced blades 240" have an angled profile, and are shown adjacent the workpiece 30 being retained on the workpiece holder 18 using the ring 42. In various embodiments, the series of spaced openings 236 and/or the series of spaced blades 240" agitate the fluid when the member 204" is moved.

As described above, the member 204,204', 204" or 204'" (referred to herein collectively as 204x) can be used to agitate the fluid. In some embodiments, the member 204x can be moved using a non-uniform oscillation profile. In one exemplary embodiment, the non-uniform oscillatory motion includes a reversal position that changes after each stoke of the non-uniform oscillatory motion.

Figure 15:
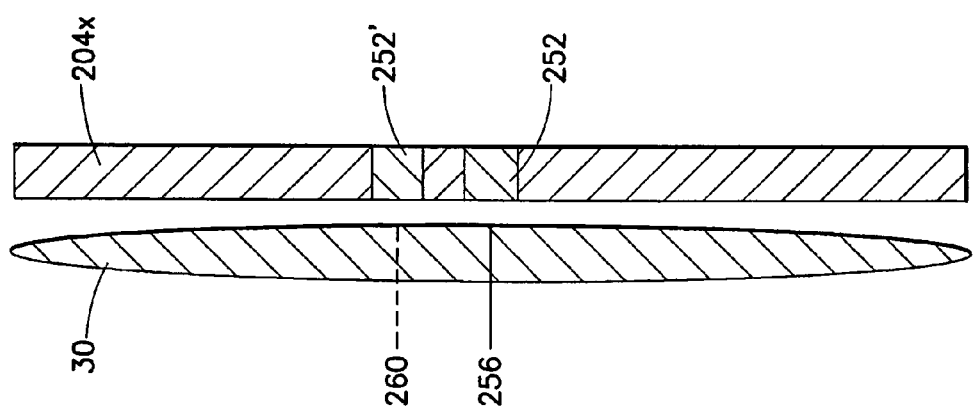
FIG. 15 depicts a diagrammatic representation of the position of a portion of a member for agitating a fluid adjacent a workpiece surface during an oscillatory motion according to the technology.

For example, referring to FIG. 15, a blade 240, 240', or 240" or a center point of a spaced opening 236 (referred to herein collectively as a center point 252) adjacent a particular workpiece point 256 on a surface of the workpiece 30 need not return to the same workpiece point 256 after one complete oscillation stroke. The center point 252 can travel along the surface of the workpiece 30 as the member 204x oscillates, and after one complete oscillation stroke, the center point 252' can be at a nearby workpiece point 260.

In one embodiment, the non-uniform oscillatory motion includes a primary oscillation stroke and at least one secondary oscillation stroke. The length of the primary oscillation stroke can be substantially the same as the separation of the spaced openings 236 defined by the member 204x. In one detailed embodiment, the length of the primary oscillation stroke can be substantially the same as the separation of adjacent spaced openings 236.

Figure 16:
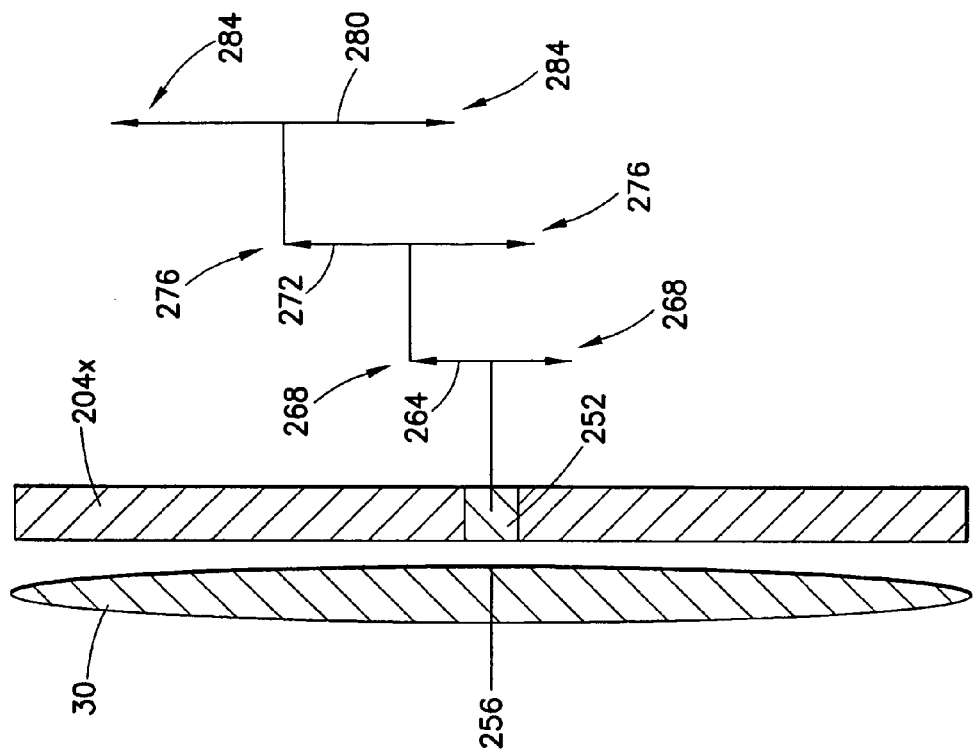
FIG. 16 shows a diagrammatic representation of oscillatory motion of a portion of a member adjacent a workpiece surface for agitating a fluid according to the technology.

Referring to FIG. 16, an exemplary primary oscillation stroke 264 can change a reversal position of an oscillation stroke of the member 204x. In one detailed embodiment, the primary oscillation stroke 264 changes a reversal position 268 of the center point 252 of the member 204x. An exemplary first secondary oscillation stroke 272 can change a reversal position of an oscillatory motion of the member 204x. In one detailed embodiment, the first secondary oscillation stroke 272 changes a reversal position 276 of the center point 252. In various embodiments, this can also be understood as changing a reversal position of the primary oscillation stroke 264. An exemplary second secondary stroke 280 can change a reversal position of an oscillatory motion of the member 204x. In one detailed embodiment, the second secondary stroke 280 changes a reversal position 284 of the center point 252. In various embodiments, this can also be understood as changing a reversal position of the first secondary oscillation stroke 272.

As illustrated, a center point 252 is used to show the relative motion of the member 204x. Any point X along the surface of the member 204x, though, can be used to show the change in reversal position of that point X as the member 204x moves. In some embodiments, the member can be formed from a plurality of pieces. Each piece includes one or more spaced openings or one or more spaced blades. In one embodiment, each piece can be connected to a separate motor so that its motion is independent of a proximate piece. In one embodiment, each piece can be connected to the same motor so that the pieces move in concert. In some embodiments, the plurality of pieces is positioned on the same side of a workpiece so that the motion of two or more pieces of the member 204x agitates the fluid.

FIG. 17 shows a graphical representation of an exemplary non-uniform oscillation profile 288 for agitating a fluid during fluid processing of a workpiece. The exemplary workpiece 30 and center point 252 in FIGS. 15 and 16 are referenced for illustrative purposes. The position of the center point 252 of the member 204x relative to the workpiece point 256 on the surface of the workpiece 30 is plotted versus time. In this embodiment of the member 204x, the separation of the center points 252 is about 20 mm. The primary oscillation stroke is substantially the same as the separation between the center point 252 and an adjacent center point of the member 204x. The secondary oscillation stroke is about 40 mm. Line 292 shows the relative travel of the center point as a result of the primary oscillation stroke. Line 296 shows the relative travel of the center point as a result of the secondary oscillation stroke.

By using a combination of primary and secondary strokes, the reversal position of the oscillation pattern in front of the workpiece 30 can change sufficiently relative to the process time. This can preclude a non-uniform time averaged electric field or fluid flow field on the surface of the workpiece. This can minimize an electric field image or a fluid flow image of the member on the surface of the workpiece, which improves the uniformity of a deposition.

FIG. 18 shows a graphical representation of another exemplary non-uniform oscillation profile 300 for agitating a fluid during fluid processing of a workpiece. In this embodiment of the member 204x, the separation of the center points 252 is about 20 mm. The primary oscillation stroke is substantially the same as the separation between the center point 252 and an adjacent center point of the member 204x. The first secondary oscillation stroke is about 30 mm. The second secondary oscillation stroke is about 40 mm. The oscillatory motion can include additional secondary oscillation strokes. Line 304 shows the relative travel of the center point as a result of the primary oscillation stroke. Line 308 shows the relative travel of the center point as a result of the first secondary oscillation stroke. Line 312 shows the relative travel of the center point as a result of the second secondary oscillation stroke.

The period of the first secondary oscillation stroke is about 2 seconds, and the period of the second secondary oscillation stroke is about 10 seconds. This can move the position at which the oscillation reversal occurs, which can spread the reversal point of each spaced blade or the center point of each spaced opening by about 0.1 mm. This can reduce or substantially eliminate any imaging of the reversal position onto the workpiece surface.

Oscillation of the member 204x can also form a non-periodic fluid boundary layer at the surface of the workpiece 30. In one embodiment, the member 204x reduces fluid boundary layer thickness at the surface of the workpiece 30. In one detailed embodiment, the fluid boundary layer thickness is reduced to less than about 10 µm. Furthermore, motion of the member can reduce or substantially eliminate entrapment of air or gas bubbles in the fluid from the surface of the workpiece 30. In one detailed embodiment, fluid flow carries the air or gas bubbles near a growing film surface in a housing 200 for plating or depositing.

Figure 19:
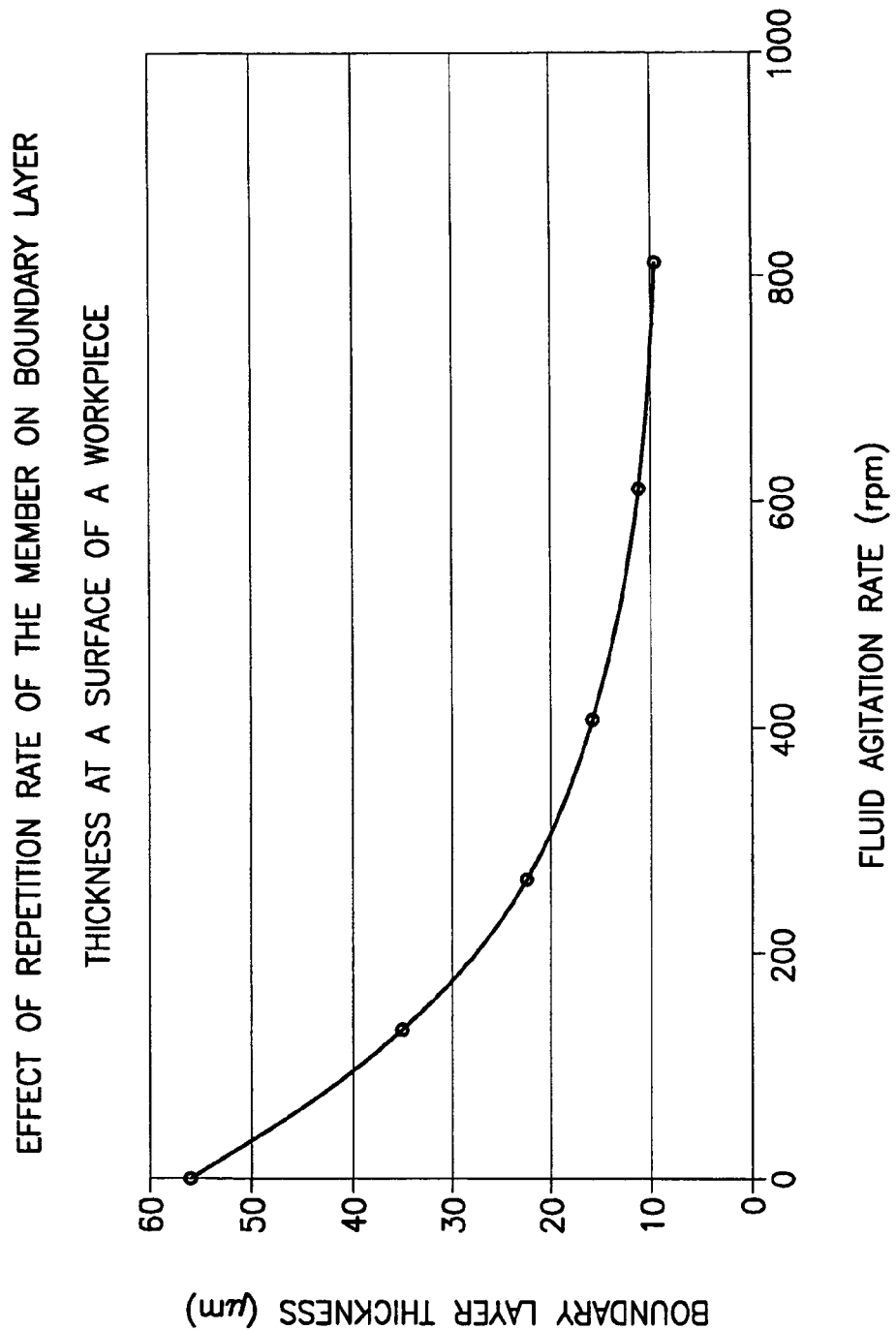
FIG. 19 shows a graphical view of boundary layer thickness versus fluid agitation speed according to the technology.

FIG. 19 illustrates a graphical representation of boundary layer thickness at a surface of a workpiece versus fluid agitation rate. The fluid agitation rate can be the oscillation rate of the member 204x. As illustrated, the fluid boundary layer thickness is reduced from about 55 (µm to less than about 10 µm as the rate is increased. The boundary layer thickness can be derived from limiting current measurements, which can be determined by comparison to known behavior of a reference electrode, by linear sweep voltammetry, or by chronoamperometry. Fluid mixing is inversely proportional to the boundary layer thickness. Therefore, decreasing the boundary layer in a fluid process can improve fluid mixing at a workpiece surface. This can improve throughput and uniformity, and can also decrease materials consumption.

Figure 20:
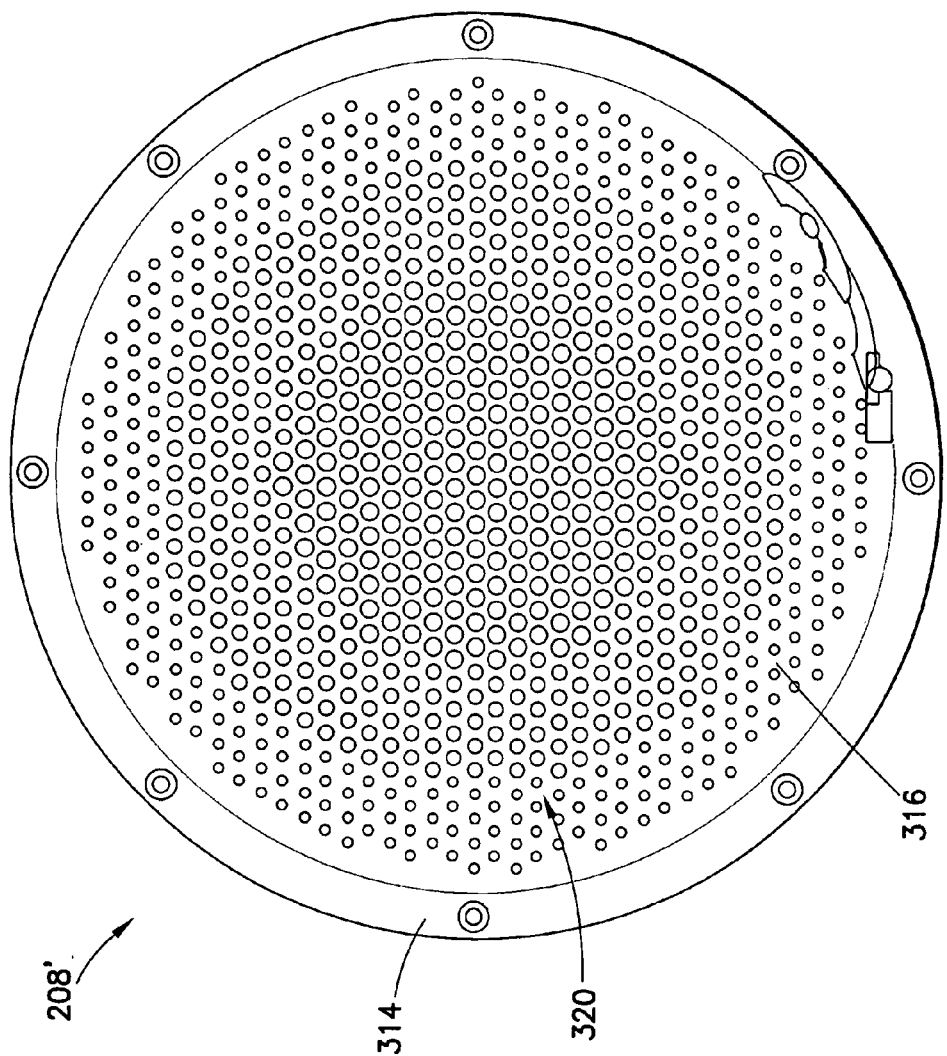
FIG. 20 depicts a plan view of an exemplary embodiment of a plate for varying an electric field during processing of a workpiece according to the technology.

FIG. 20 depicts an exemplary embodiment of a plate 208' for varying an electric field during processing of a workpiece 30. Varying the electric field at the workpiece surface can promote uniform deposition of a film, although the electric potential drop through the workpiece surface varies from the workpiece perimeter to the workpiece center. In one embodiment, the plate 208' is fabricated from a non-conducting material that can block the electric field as it passes from the plane of the anode 212 to the plane of surface of the workpiece 30. The plate 208' has a substantially circular shape. The plate 208' can include fastening holes 314 for connecting the plate 208' to the housing 200 or 200', or to a support feature (not shown) that suspends the plate 208' in the housing 200 or 200'.

In one embodiment, the plate 208 (shown in FIGS. 10 and 11) or 208' (shown in FIG. 20) shapes the electric field incident on a surface of the workpiece 30. A body 316 of the plate 208 or 208' can define a plurality of holes 320. The holes 320 can have a distribution of hole sizes, e.g., the diameter of the holes can vary on a surface of the plate. By varying the distribution of hole sizes, the average open area of a surface of the plate 208 or 208' can be varied, and a property of the electric field passing through the plate 208 or 208' to the surface of the workpiece 30 can be varied. The property of the electric field that is varied can be amplitude or potential. In various embodiments, the electric field proximate to the surface of the workpiece can be uniform.

In one embodiment, the distribution of hole sizes comprises a continuous gradient of hole size. In one detailed embodiment, the holes vary in a substantially radial pattern. For example, as illustrated in FIG. 20, larger holes can be formed near the center of the plate 208' while smaller holes are formed closer to the outer perimeter of the plate 208'. In various embodiments, the plate can have between about 500 and about 10,000 holes, although more or fewer holes can be used depending on the application and/or the workpiece size. In one embodiment, the plate can have between about 1,000 and about 5,000 holes. In one detailed embodiment, the plate 208 or 208' can have about 3000 holes and be suitable for a 200 mm workpiece. In various embodiments, the diameter of the holes is between about 0.1 mm and about 20 mm, although larger and smaller diameter holes can be used depending on the application. In one embodiment, the largest diameter holes can be about 5 mm in diameter. The smallest diameter holes can have a diameter of about 1 mm.

Figure 21A:
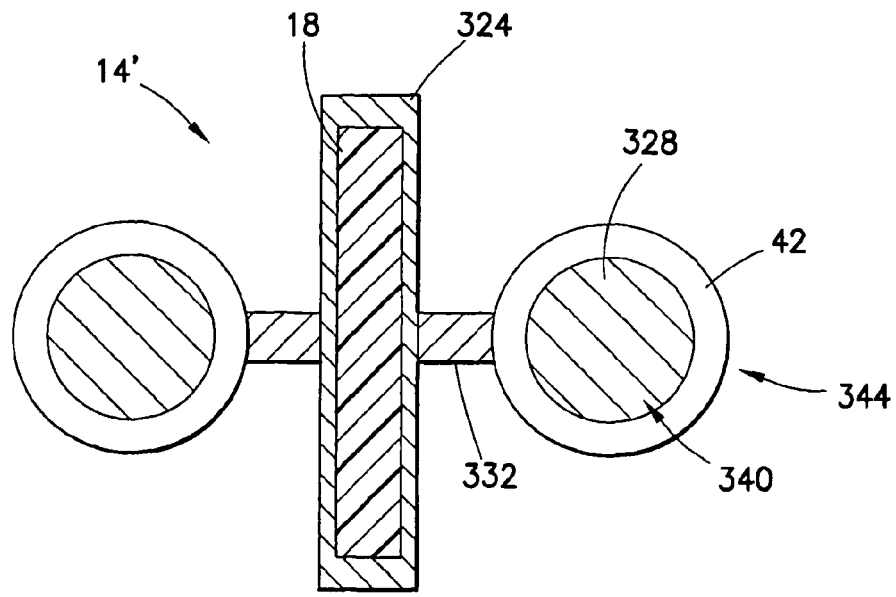
FIG. 21A shows a plan view of an exemplary loading station for workpieces according to the technology.
Figure 21B:
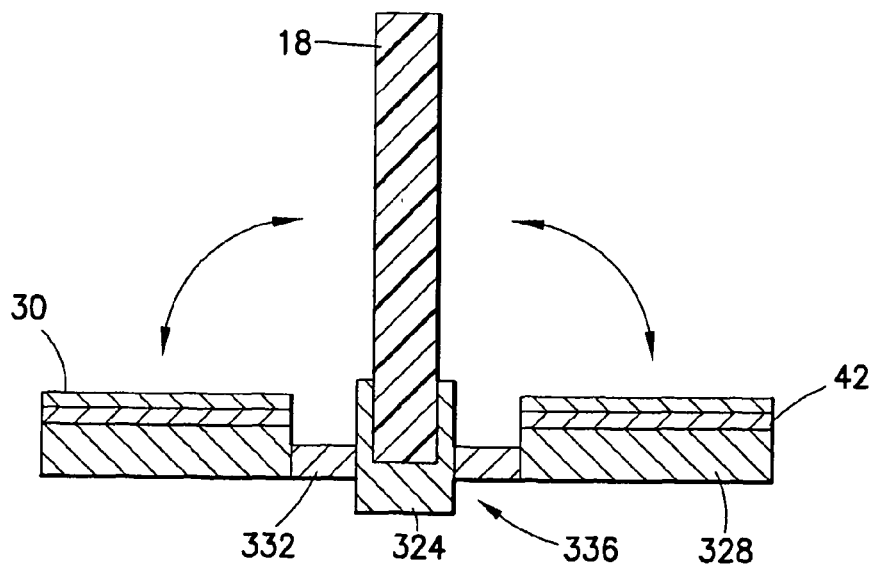
FIG. 21B shows a side view of the loading station depicted in FIG. 21A.

FIGS. 21A and 21B show an illustrative embodiment of a loading station 14', which can be used to load one or more workpieces 30 on an embodiment of the workpiece holder 18. FIGS. 21A and 21B include a holder 324 for the workpiece holder 18, a base member 328 for moving a workpiece 30, and an arm 332 connecting the holder 324 and the base member 328. FIG. 21B shows workpieces 30 loaded onto the base member 328. The arm 332 and the holder 324 can include a hinged connection 336 so that the arm 332 can move the base member 328 between a substantially horizontal position and a substantially vertical position, or to an intermediate position. The base member 328 and the arm 332 can be components of the same piece.

The holder 324 can retain the workpiece holder 18 while workpieces 30 are being loaded onto or removed from the workpiece holder 18. In some embodiments, the holder 324 can retain the workpiece holder 18 while workpieces 30 are being loaded onto or removed from the base member 328. The holder 324 can be a suitable metal, plastic, or polymer material. A second end effector (not shown) can be used to load a workpiece 30 onto the base 328. The loading station 14' can be coupled to a hydraulic mechanism and/or a computer to control the position of the arm 332.

In various embodiments, the base member 328 can include an end effector 340 positioned in the central portion of the base member 328 and a chuck 344 positioned around the outer perimeter of the base member 328. The end effector 340 can be a Bernoulli end effector, an electrostatic chuck, or a vacuum end effector. The end effector 340 can retain a workpiece 30 without contacting it. In some embodiments, the chuck 344 is a vacuum chuck or a suction chuck. The chuck 344 can retain the ring 42 on the base member 328. In one embodiment, the end effector 340 can retain the workpiece 30 against the ring 42 while the workpiece 30 is loaded onto or removed from the workpiece holder 18. In one embodiment, the end effector 340 can retain the workpiece 30 against the ring 42 without contacting the workpiece 30.

In one embodiment, to load a workpiece 30 onto the workpiece holder 18, the ring 42 is engaged by the chuck 344. The workpiece 30 can be placed on the ring 42. The end effector 340 can be activated to hold the workpiece 30 against the ring 42. The arm 332 can be moved to a substantially vertical position. The workpiece holder 18 can engage the ring 42. The end effector 340 can be disengaged from the workpiece 30, and the chuck 344 can be disengaged from the ring 42. The arm 332 can be moved from the plane of the workpiece holder 18 so that there is clearance. The workpiece holder 18 can be removed from the holder 324 and directed to a module for processing. The steps need not be completed in this order to load the workpiece 30.

In one embodiment, to remove a workpiece 30 from the workpiece holder 18, the arm 332 can be moved to a substantially vertical position. The end effector 340 can engage the workpiece 30, and the chuck 344 can engage the ring 42. The ring 42 is disengaged from the workpiece holder 18. The arm 332 can be moved to a substantially horizontal position. The steps need not be completed in this order to remove the workpiece 30.

The loading station 14' can load a single workpiece 30 to a workpiece holder 18, or can load a plurality of workpieces 30 to a workpiece holder 18. In one embodiment, two workpieces are loaded onto the workpiece holder 18 substantially concurrently. In one embodiment, two workpieces are removed from the workpiece holder 18 substantially concurrently. In some embodiments, a first workpiece is loaded onto or removed from the workpiece holder 18 before a second workpiece is loaded or removed.

FIG. 22A shows an illustrative embodiment of an apparatus 400 for wetting a workpiece 30 having a front surface and a back surface. The apparatus 400 includes a workpiece holder 18 disposed in a module 22. The module 22 can be a process module, a chamber, or a vacuum chamber. The module 22 can be adapted to operate at a pressure below atmospheric pressure.

The module 22 can include a lid 210 to create a seal between the lid 210 and the module 22. In some embodiments, the seal is a vacuum seal. The seal can be adapted to retain a pressure below about 500 Torr, 100 Torr, 10 Torr, or 1 Torr absolute. The pressure can be controlled to be above or below the vapor pressure of a liquid that is used in the process. In some embodiments, the module 22 retains the reduced pressure in the module 22 for between 10 to 500 seconds, 100 to 400 seconds, or 200 to 300 seconds. In some embodiments, the module 22 maintains the reduced pressure for approximately 20 seconds.

The workpiece holder 18 includes a body 38 and a recess 50. Recess 50 can be a cavity defined in the body 38 and can extend from a surface 43 of the body 38.

Ring 42 can be adapted to press, hold, and/or retain the workpiece 30 on the surface 43 of the body 38 over the recess 50. The ring 42 can form a fluid seal relative to the workpiece 30 and to the workpiece holder 18. The fluid seal from the ring 42 can allow the front surface of the workpiece to be exposed to a fluid (e.g., a substantially degassed fluid) while the back surface of the workpiece 30 is not exposed to or in contact with the fluid.

Port 86 is defined in the body 38 of the workpiece holder 420 and can be in communication with the recess 50. In some embodiments, the port 86 communicates with the recess 50 via a conduit 465 defined in the body 38. A gas, such as air, can be introduced to or evacuated from the recess 50 via the port 86. As the pressure in the module 22 changes from a first pressure to a second pressure, the port 86 affects pressure in the recess 50 to minimize a pressure differential between the front and back surfaces of the workpiece 30. In some embodiments, the port 86 communicates a pressure change (e.g., an increase and/or a decrease in pressure) in the module 22 to the back surface of the workpiece 30 via the port 86. Minimizing the pressure differential between the front and back surfaces of the workpiece 30 is advantageous because the pressure differential can cause stress and/or strain on a surface (e.g., the front or back surface) of the workpiece 30, which can lead to the workpiece 30 warping, breaking, and/or fracturing.

A fluid port 470 is in fluid communication with the module 22. The fluid port 470 can be disposed on a sidewall 220 of the module 22 or a bottom portion of the module 22. The fluid port 470 can deliver a fluid (e.g., a substantially degassed fluid and/or deionized water) to the module 22 to wet the front surface of the workpiece 30. The fluid port 470 can also deliver an electroplating solution. In some embodiments, the fluid does not contact the back surface of the workpiece 30 because the ring 42 provides a fluid seal to the workpiece 30. The fluid port 470 can introduce the fluid during operation of the module 22 at a reduced pressure relative to atmosphere.

The fluid port 470 can introduce the fluid into a bottom portion of the module 22. The fluid can flow upwards from the bottom portion towards a top portion of the module 22. The reduced pressure of the module 22 can cause a reduction in surface tension between the front surface of the workpiece 30 and the fluid. Reduced surface tension can promote more uniform contact between the fluid and the front surface of the workpiece 30, which can lead to more uniform and/or repeatable electrodeposition processing.

Figure 22B:
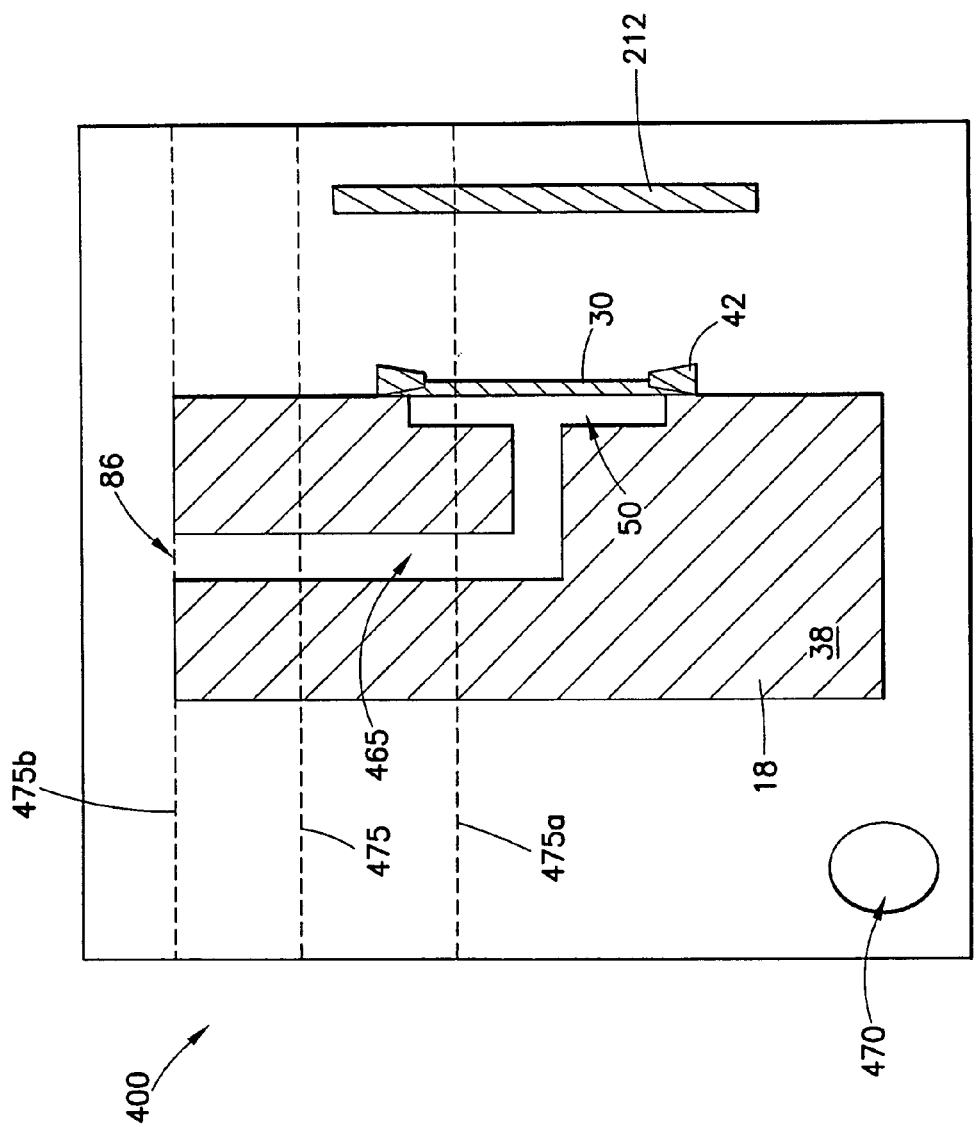
FIG. 22B depicts a sectional view of the workpiece holder shown in FIG. 22A.

FIG. 22B depicts a sectional view of the apparatus 400 depicted in FIG. 22 A. The fluid seal from the ring 42 can allow the front surface of the workpiece 30 to be exposed to a fluid (e.g., a substantially degassed fluid) while preventing fluid from reaching the back surface. Maintaining a dry back surface of the workpiece 30 can minimize material accumulation (e.g., chemicals or impurities) on the back surface of the workpiece. Any material that accumulates on the back surface of the workpiece 30 can become dislodged and contact the front surface of the workpiece 30, resulting in the introduction of an impurities or defects to the front surface (e.g., a semiconductor die) of the workpiece 30. Impurities and/or defects can cause reduced manufacturing yields, resulting in increased manufacturing costs.

The port 86 is shown in a region of the body 38 above a fluid-fill line 475 of the fluid such that the fluid is prevented from contacting the port 86 and/or entering the conduit 465. The fluid-fill line 475 can be at a height between a first line 475a corresponding to the top of the exposed portion of the workpiece 30 and a second line 475b corresponding to the port 86. The port 86 can communicate the pressure in the module 22 through the conduit 465 to the recess 50 to minimize a pressure differential between the front and back surfaces of the workpiece 30.

In certain embodiments, the workpiece 30 can be the cathode and current can be applied between the cathode (e.g., the workpiece 30) and the anode 212. In some embodiments, the workpiece 30 is the anode, and electrode 212 is the cathode.

Figure 23:
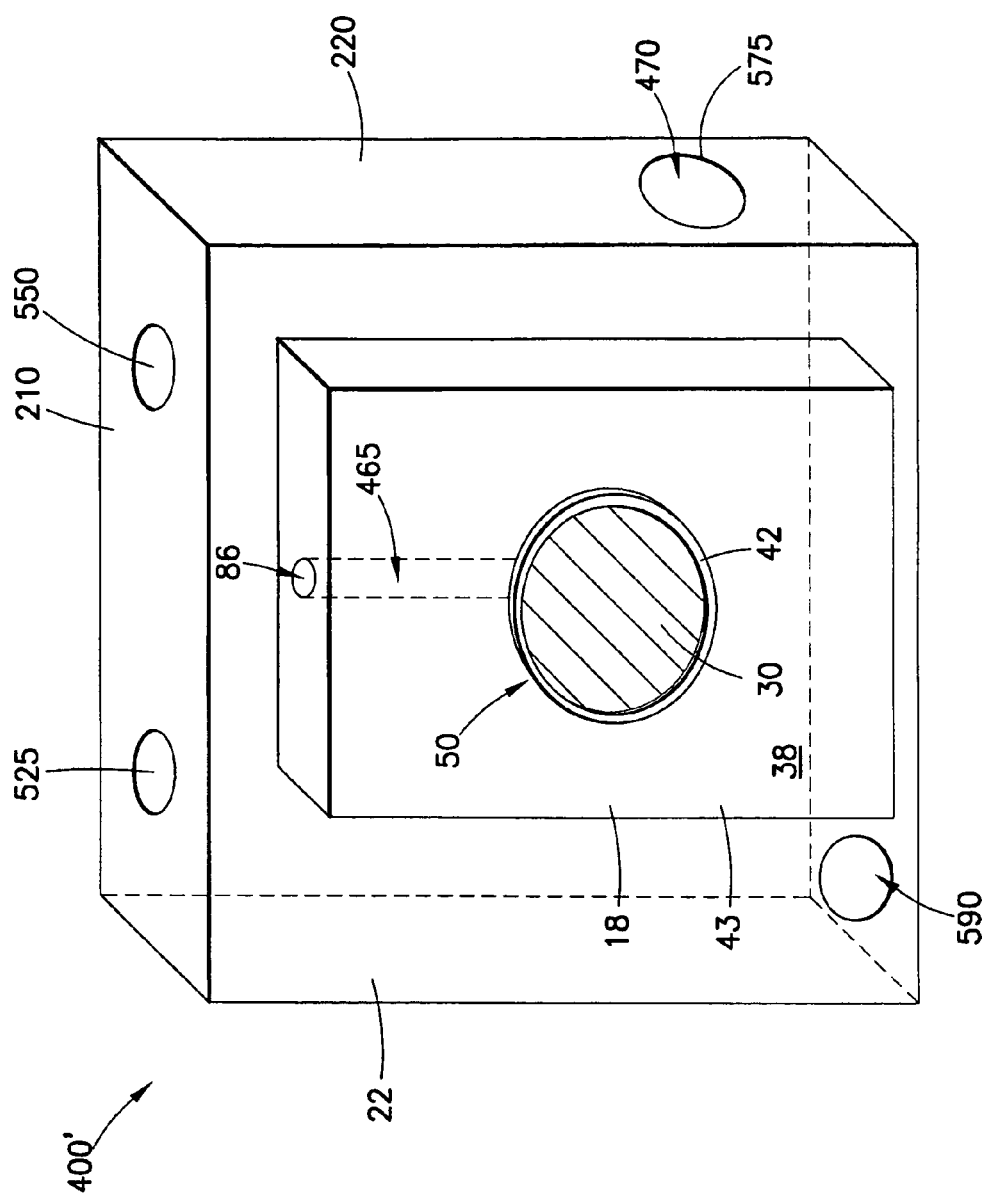
FIG. 23 shows an embodiment of an apparatus for wetting a workpiece.

FIG. 23 shows another embodiment of an apparatus 400' for wetting a workpiece 30. This embodiment of the apparatus 400' includes a pumping system 525, a vent valve 550, a fluid source 575, and a drain 590. The pumping system 525 (e.g., a pump or a vacuum) is in communication with the module 22 to reduce pressure in the module 22 from a first pressure (e.g., atmospheric pressure) to a second pressure (e.g., less than 100 Torr absolute). A pump valve (not shown) can be in communication with the low-pressure source 525 and the module 42 to regulate pressure in the module 22. In some embodiments, a water trap (not shown) is disposed between the pumping system 525 and the module 22 to prevent fluid from entering the pumping system 525.

Vent valve 550 is in communication with the module 22 to increase pressure in the module 22. The vent valve can be disposed on the lid 210 or on a sidewall 220 of the module 22. The vent valve 550 can be in communication with the atmosphere to permit ambient gas (e.g., air) to enter the module 22. The ambient gas can increase the pressure in the module 22 from a first pressure (e.g., less than 100 Torr absolute) to a second pressure (e.g., atmospheric pressure).

In other embodiments, the vent valve 550 is in communication with a gas source (e.g., nitrogen, oxygen, argon, etc.) that is maintained at least at a pressure greater than the minimum module 22 pressure (e.g., 100 Torr absolute). In some embodiments, the gas source is maintained at atmospheric pressure. In some embodiments, the gas source is maintained at a pressure greater than atmospheric pressure.

Fluid source 575 is coupled to the fluid port 470 and delivers a fluid to the module 22 to wet the front surface of the workpiece 30. The fluid source 575 can be adapted to contain the fluid (e.g., deionized water).

The fluid can be a substantially degassed fluid. The fluid can include inorganic molecules, organic molecules, or a combination. In some embodiments, the inorganic and/or organic molecules include ionic species. The inorganic molecules can include deionized water. The organic molecules can include bis(3-sulfopropyl) disulfide ("SPS"). In some embodiments, the organic molecules can accelerate fluid processing. The ionic species can include chloride. In some embodiments, the ionic species function as catalysts for fluid processing. In some embodiments, the fluid includes electrodeposition fluids.

Drain 590 is shown in a bottom portion of the module 22. The drain 590 can be adapted to remove at least a portion of the fluid. The drain 590 can be disposed on the sidewall 220 of the module 22. The drain 590 can be in communication with a valve (not shown) to regulate the fluid level in the module 22. Drain 590 can be used to dump fluid from the module 22 after the module 22 is vented to atmosphere.

FIGS. 24A-24F illustrate a process of wetting a workpiece 30. FIG. 24 A depicts a first step of the process. A workpiece 30 is retained on a surface of a workpiece holder 18 disposed in a module at atmospheric pressure. The workpiece 30 can have features 38 defined in a front surface of the workpiece 30. The module can be filled with a gas at atmospheric pressure. The gas can fill an interior region of the module and the features 38.

Figure 24A:
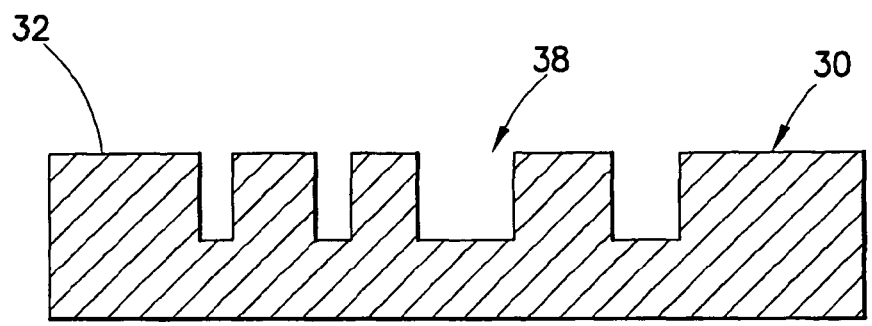
FIGS. 24A-24F illustrate a process for wetting a workpiece.
Figure 24B:
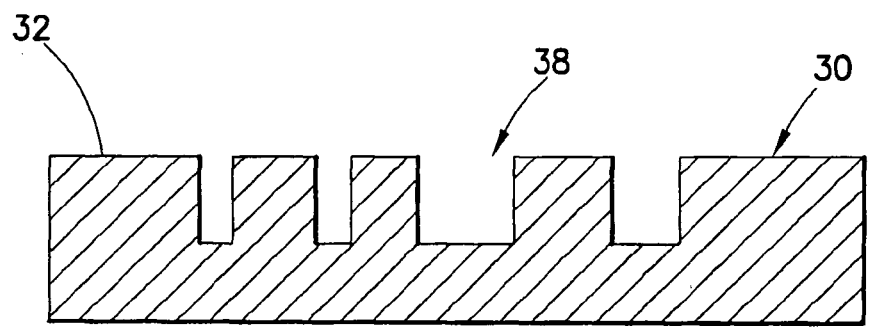

FIG. 24B depicts a second step of the process. Pressure is reduced relative to atmospheric pressure in the interior region of the module. A pumping system can remove at least a portion of the gas from the interior region of the module, leaving a gas at a reduced pressure (e.g., less than 100 Torr absolute). The low-pressure gas can fill the interior region of the module and the features 38. The module can maintain the reduced pressure for between 10 to 500 seconds, 100 to 400 seconds, or 200 to 300 seconds. In some embodiments, the module maintains the reduced pressure for approximately 20 seconds.

Figure 24C:
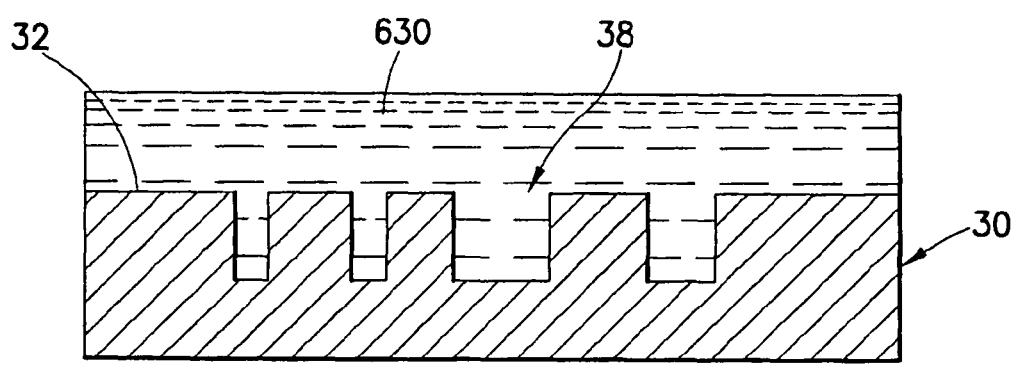

FIG. 24C depicts a third step of the process. After the pressure has been reduced, a fluid 630 is introduced to the module to wet the front surface of the workpiece 30. In some embodiments, the fluid is introduced from a bottom portion of the module. The fluid 630 can contact the front surface of the workpiece 30, including portions of the front surface that define the features 38. In some embodiments, the fluid 630 displaces a gas or contaminant disposed in or on one or more of the features 38. The absence of air or other gas molecules within microscale features of the workpiece surface can reduce the surface tension between the front surface of the workpiece 30 and the fluid 630. The reduced surface tension can promote substantially uniform contact between the front surface of the workpiece 30 and the fluid 630, which can allow for a more consistent and/or uniform electrodeposition process in steps subsequent to the wetting process.

Figure 24D:
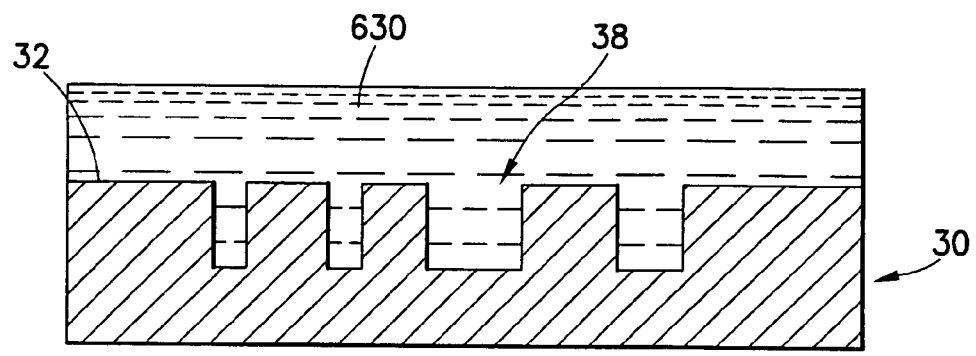

FIG. 24D depicts a fourth step of the process. After the fluid 630 has been introduced to the module to wet the front surface of the workpiece 30, the module can be vented. The module can be vented to atmospheric pressure or an intermediate pressure between the reduced pressure and atmospheric pressure. The module can be filled with a gas (e.g., air) at atmospheric pressure.

Figure 24E:
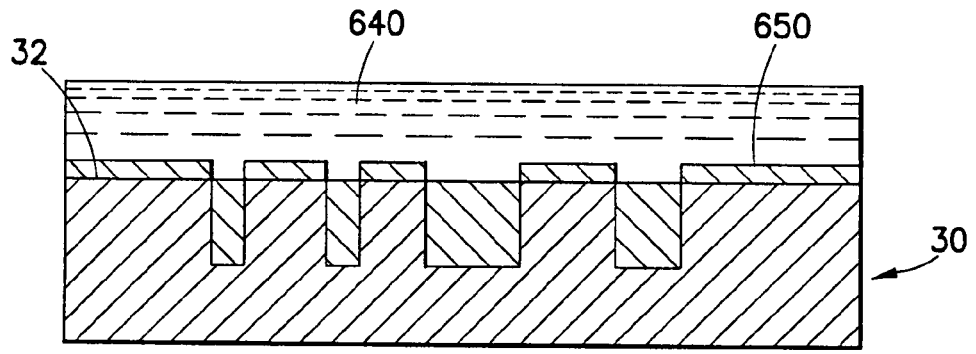
Figure 24F:
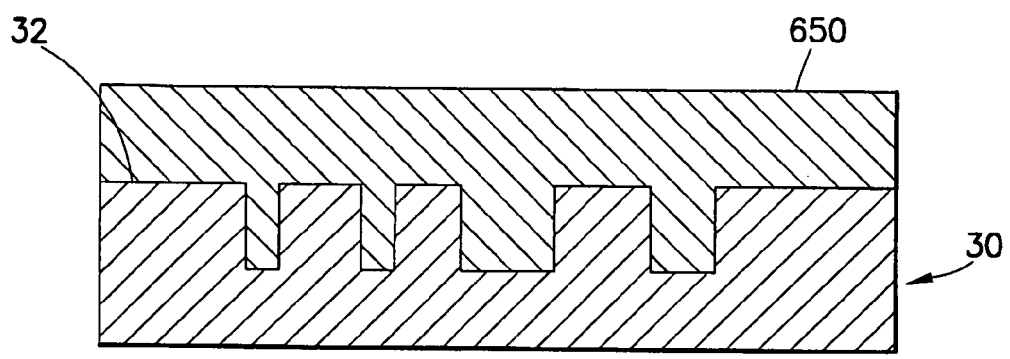

FIGS. 24E and 24F depict an optional fifth step of the process. The fluid can be an electrodeposition fluid 640 containing metallic ions (e.g., $Cu^{2+}$). A current can be applied between an anode and a cathode (one of which can be the workpiece 30), which can result in metal 650 (e.g., copper) depositing on the front surface of the workpiece 30. In some embodiments, the electrical potential between the anode and the cathode can serve to avoid disadvantageous etching of the workpiece surface material.

The substantially uniform contact between the electrodeposition fluid 640 and the front surface of the workpiece 30 can result in a substantially uniform metal deposition 650. FIG. 24E depicts the initial formation of the electrodeposited metal 650 on the front surface of the workpiece 30. FIG. 24F depicts the front surface of the workpiece 30 at the end of the electrodeposition process. The metal 650 can be uniformly deposited on the front surface of the workpiece 30.

In various embodiments, the workpiece holder can be moved into a wetting process module that is capable of being evacuated to a pressure below approximately 10 Torr absolute. A lid on the wetting process module can be closed and a vacuum seal can be formed between the lid and the wetting process module. A valve connected to the wetting process module can be opened to permit gas flow from the wetting process module to a vacuum pump. The wetting process module along with the internal cavities of the workpiece holder, if it has any, can be evacuated to a pressure below approximately 100 Torr or 10 Torr. The wetting process module can be maintained at this low pressure for approximately 10 to 500 seconds to remove gas from features within the workpiece holder and/or from features on the workpiece itself.

Figure 25:
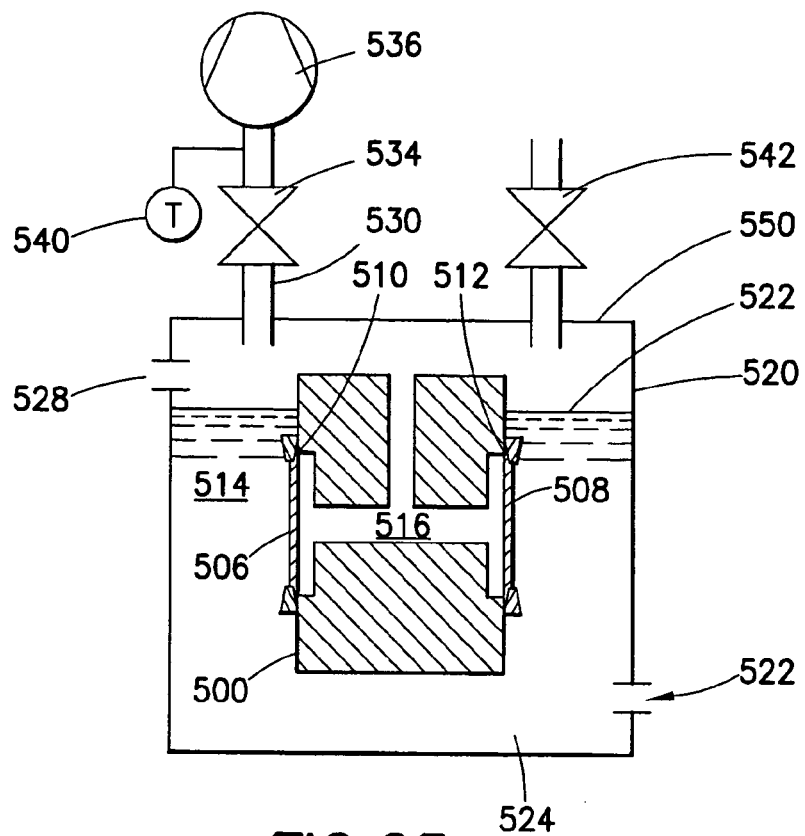
FIG. 25 shows an embodiment of an apparatus for wetting a workpiece.

Referring now to FIG. 25, in some embodiments, the workpiece holder 500 retains two silicon wafers 506, 508 in a back-to-back configuration with a fluid seal and/or electrical contact 510, 512 at the perimeter of each wafer. The evacuated condition can be maintained for between approximately 10 to 60 seconds or 20 seconds. A minimal pressure differential between the two sides 514, 516 of the workpiece 500 can be ensured while the edge of the workpiece is constrained to be fluid sealed. The fluid seal can prevent the edge of the workpiece from being an accessible path for the gas flow required to ensure substantially equal pressures on the two sides of the workpiece.

After the wetting process module 520 has been evacuated, a wetting fluid 522 (e.g., a substantially degassed fluid) can be introduced into the wetting process module 520. In some embodiments, the fluid 522 is introduced at the bottom 524 of the wetting process module 520. The fluid 522 can flow upward and cover the workpiece in a flow path that ensures the last place to be covered with fluid is a fluid measurement port 528 positioned lower than the exit port 530 to the vacuum pump line so that fluid flow is stopped and does not flow into the vacuum pump line. The vacuum pump line 530 can be in fluid communication with the wetting process 520 module, a vacuum valve 534, and the vacuum pump 536. A water trap 540 can be disposed between the vacuum pump 536 and the wetting process module 520 to avoid fluid 522 entering the vacuum pump 536.

The vacuum valve 534 can be closed and a vent valve 542 can be opened to allow the wetting process module 520 to equilibrate with atmospheric pressure P. The lid 550 can be opened and moved away from an entrance to the wetting process module 520. The workpiece holder 500, along with the now wetted workpiece(s) 506, 508, can be lifted out of the wetting process module 520 and transported to the next fluid processing step. The workpiece holder 500 and/or the workpiece(s) 506, 508 can be lifted out by an automatic transfer device, which can move the workpiece holder 500 to subsequent wet process chemistry modules.

Figure 26:
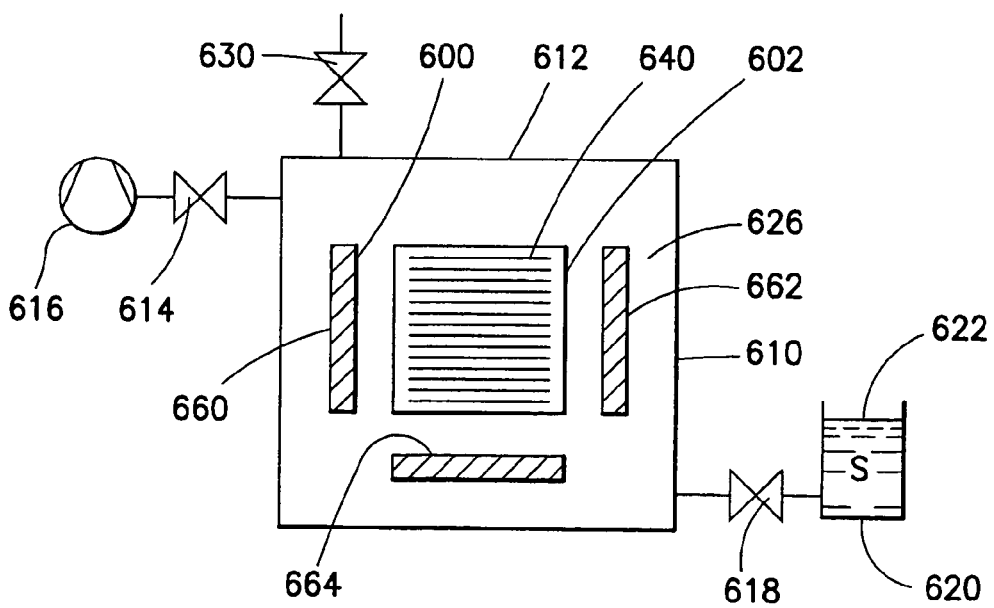
FIG. 26 shows an embodiment of an apparatus for wetting a workpiece.

Referring now to FIG. 26, in some embodiments, a plurality of workpieces 600 can be held in a workpiece holder 602 such as a wafer cassette. The wafer cassette 602 along with the workpieces 600 can be inserted into a wetting process module 610. A lid 612 can be closed on the wetting process module 610 to form a gas seal. Air can be removed from the wetting process module by opening a valve 614 in communication with a vacuum pump 616. The workpiece holder 602 and workpieces 600 can be maintained at a vacuum level of less than approximately 100 Torr or 10 Torr for approximately 10 to 500 seconds or 20 seconds. Fluids, such as deionized water that has been degassed, can be introduced into the wetting process module by opening a valve 618 that can communicate with a fluid source 620 or a reservoir. The fluid 622 can be degassed, deionized water. The fluid 622 can include trace amounts of surface active organic molecules that can influence the subsequent electrodeposition or electroless deposition processes. For example, the organic molecules can include a family of small organic molecules referred to as "accelerators," such as SPS $(S(CH2)3S03H)2$, and/or ionic species with catalytic properties such as chloride ions. Low pressure 626 in the evacuated wetting process module 610 can pull the fluid 622 from the fluid source or reservoir 620, which can be maintained at atmospheric pressure, or from a pressurized line source, into the wetting process module. Fluid can be pulled into the wetting process module until the exposed surface of the workpiece 600 is covered by fluid. This step can take from approximately 1 to 100 seconds or 10 to 20 seconds. As fluid flows across the evacuated workpiece surface, there is a minimal or no air-to-workpiece interface to prevent the fluid from wetting the features on the workpiece surface, so the fluid can contact the features on the workpiece surface. After the workpiece surface is coated with fluid, the valve 618 to the fluid source 620 can be closed, the valve 614 to the vacuum pump 616 can be closed, a vent valve 630 to atmosphere can be opened, the lid 612 on the wetting process module 610 can be opened, and the workpiece holder 602 and/or the workpiece(s) 600 can be removed.

The workpiece 600 can be inserted into a holding mechanism 602 such that the workpiece 600 can be held in a horizontal orientation as shown. The workpiece 600 can be suspended from an edge 640 and can be held by a mechanism 602 in the wetting process module 610 itself, or a mechanism on the lid 612 of the wetting process module 610. The lid 612 of the wetting process module 610 can be closed and can form a vacuum-tight seal. A valve 614 can be opened to communicate with a vacuum pump 616. After the workpiece surface is wetted, the wetting process module can be vented, the lid can be opened, and the workpiece can be removed from either the wetting process module holding mechanism or the lid holding mechanism.

An anode 660, or a plurality of anodes 660, 662, can be disposed in the wetting process module 610. The anode(s) can be disposed in the wetting process module such that, when the workpiece holder 602 is inserted in the wetting process module 610, an anode surface 664 can be substantially parallel to each workpiece surface. The workpiece holder 602 can be configured to apply an electrical contact to the perimeter of the workpiece. The workpiece can be coated with a substantially thin layer of conducting metal, for example, 100 angstroms of copper. Workpiece transfer, gas removal by vacuum pumping, and fluid introduction can proceed as described for previous embodiments while an electropotential can be maintained between the anode and cathode. The fluid 622 can be an electroplating chemistry, for example, a copper electroplating chemistry. As the fluid contacts the workpiece surface, metal ions can be reduced to metal and can deposit on the workpiece surface. The applied potential can eliminate the risk of defects that can be caused by an acid in the electroplating chemistry that can attack the very thin copper seed layer prior to being coated with deposited metal.

While the technology has been particularly shown and described with reference to specific illustrative embodiments, it should be understood that various changes in form and detail may be made without departing from the spirit and scope of the technology as defined by the appended claims. For example, although specific actions, movements, and processes may be described with reference to specific embodiments, these actions, movements, and processes may be performed by any embodiment employing like or similar features. Likewise, although the technology, in some embodiments, is described as a system employing individual features, some of the features can be utilized independent of the system.

What is claimed is:

1. An apparatus for wetting a workpiece having front and back surfaces, the apparatus comprising:
    a chamber arranged to operate at a reduced pressure;
    a workpiece holder disposed in the chamber, the workpiece holder comprising:
    a body comprising a surface, the body defining a cavity extending from the surface;
    a ring adapted to retain the workpiece on the surface of the body over the cavity, the ring forming a fluid seal relative to the workpiece and to the workpiece holder; and
    a port defined in the body and in communication with the cavity, the port affecting pressure in the cavity to reduce a pressure differential between the front and back surfaces of the workpiece; and
    a fluid port in communication with the chamber, the fluid port delivering a fluid to wet the front surface of the workpiece during operation of the chamber at a reduced pressure relative to atmosphere.

2. The apparatus of claim 1 wherein the chamber comprises a vent valve to return the chamber to atmospheric pressure.

3. The apparatus of claim 1 further comprising a fluid source containing the fluid coupled to the fluid port.

4. The apparatus of claim 1 wherein the fluid port is positioned in a bottom portion of the chamber.

5. The apparatus of claim 1 wherein the fluid comprises a substantially degassed fluid.

6. The apparatus of claim 1 wherein the fluid comprises deionized water.

7. The apparatus of claim 1 wherein the fluid comprises organic molecules.

8. The apparatus of claim 1 wherein the ring comprises contacts adapted for electrical communication with the workpiece.

9. The apparatus of claim 1 further comprising an electrode adapted to deliver an electric potential to or receive an electric potential from the workpiece while the workpiece is immersed in the fluid.

10. A method of wetting a workpiece having front and back surfaces, the method comprising:
    retaining the workpiece on a surface of a workpiece holder disposed in a chamber to create fluid seals between a ring and the workpiece and between the ring and the workpiece holder; reducing pressure in the chamber relative to atmospheric pressure;
    reducing a pressure differential between the front and back surfaces of the workpiece; and
    introducing a fluid to the chamber to wet the front surface of the workpiece.

11. The method of claim 10 further comprising reducing surface tension between the surface of the workpiece and the fluid.

12. The method of claim 10 wherein wetting the workpiece comprises contacting features in the workpiece with the fluid to displace a gas or contaminant.

13. The method of claim 10 further comprising venting the chamber to atmospheric pressure after the workpiece is wet.

14. The method of claim 10 further comprising introducing the fluid from a bottom portion of the chamber.

15. The method of claim 10 wherein the fluid comprises a substantially degassed fluid.

16. The method of claim 10 wherein the substantially degassed fluid comprises deionized water.

17. The method of claim 10 wherein the substantially degassed fluid comprises organic molecules.

18. The method of claim 10 further comprising delivering an electric potential to or receiving an electric potential from the workpiece while the workpiece is immersed in the fluid.

19. An apparatus for wetting a workpiece having front and back surfaces, the apparatus comprising:
    means for retaining the workpiece on a surface of a workpiece holder disposed in a chamber and for sealing the back surface of the workpiece from the chamber;
    means for reducing pressure in the chamber relative to atmospheric pressure;
    means for reducing a pressure differential between the front and back surfaces of the workpiece; and
    means for introducing a fluid into the chamber to wet the front surface of the workpiece.

20. The apparatus of claim 19, wherein the means for introducing introduces the fluid into the chamber while the chamber is at a reduced pressure relative to atmospheric pressure by the means for reducing pressure.

* * * * *